United States Patent
Okamoto et al.

(10) Patent No.: US 7,420,130 B2
(45) Date of Patent: Sep. 2, 2008

(54) WIRING BOARD AND METHOD FOR FABRICATING THE SAME

(75) Inventors: Keishiro Okamoto, Kawasaki (JP); Tomoyuki Abe, Kawasaki (JP); Motoaki Tani, Kawasaki (JP); Nobuyuki Hayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/812,124

(22) Filed: Jun. 15, 2007

(65) Prior Publication Data

US 2007/0240901 A1    Oct. 18, 2007

Related U.S. Application Data

(62) Division of application No. 11/138,467, filed on May 27, 2005, now Pat. No. 7,246,435.

(30) Foreign Application Priority Data

Feb. 9, 2005    (JP)    ............................. 2005-033274

(51) Int. Cl.
*H01R 12/04*    (2006.01)
*H05K 1/11*    (2006.01)

(52) U.S. Cl. ...................... 174/262; 361/792
(58) Field of Classification Search ......... 174/262–266; 361/792–795

See application file for complete search history.

(56) References Cited

U.S. PATENT DOCUMENTS

| 3,294,576 | A | * | 12/1966 | Geraghty | ................... 427/97.5 |
| 3,934,334 | A | * | 1/1976 | Hanni | ......................... 29/846 |
| 3,934,335 | A | * | 1/1976 | Nelson | ........................ 29/847 |
| 5,231,751 | A |   | 8/1993 | Sachdev et al. | |
| 5,257,452 | A | * | 11/1993 | Imai et al. | ...................... 29/846 |
| 6,165,629 | A |   | 12/2000 | Sachdev et al. | |
| 2005/0247482 | A1 |   | 11/2005 | Nakamura | |

FOREIGN PATENT DOCUMENTS

| JP | 2000-133942 A | 5/2000 |
| JP | 2000-236167 A | 8/2000 |
| JP | 2002-084072 A | 3/2002 |
| JP | 2002-100869 A | 4/2002 |

* cited by examiner

*Primary Examiner*—Jeremy C Norris
(74) *Attorney, Agent, or Firm*—Westerman, Hattori, Daniels & Adrian, LLP.

(57) ABSTRACT

The wiring board comprises a plate-shaped conductive core material 10 with a through-hole 12 formed in, an insulation layer 14 formed on the surface of the conductive core material 10 and on the inside wall of the through-hole 12, a resin 18 buried in the through-hole 12 with the insulation layer 14 formed in, wirings 22a, 22b formed on the upper surface and the undersurface of the conductive core material 10 with the insulation layer 14 formed on, and an wiring 22d formed in the through-hole 20 formed in the resin 18 and electrically connected to the wirings 22a, 22b.

7 Claims, 18 Drawing Sheets

WIRING BOARD AND METHOD FOR FABRICATING THE SAME

This application is a division of application Ser. No. 11/138,467 filed May 27, 2005, now U.S. Pat. No. 7,246,435 which is hereby incorporated by reference in its entirety.

CROSS-REFERENCE TO RELATED APPLICATIONS

This application is based upon and claims priority of Japanese Patent Application No. 2005-033274, filed on Feb. 9, 2005, the contents being incorporated herein by reference.

BACKGROUND OF THE INVENTION

The present invention relates to a wiring board and a method for fabricating the same, more specifically, a wiring board including a conductive core material, and a method for fabricating the same.

Recently, electronic apparatuses rapidly have higher performance and are smaller-sized. The semiconductor devices forming the electronic apparatuses, and the wiring boards for the semiconductor devices to be mounted on are required to be accordingly small and thin and to have high performance and high reliability. To meet such requirements, as a semiconductor device mounting technology, bare chip assembly, which mounts semiconductor devices directly on a printed wiring board, is used.

As semiconductor devices have more pins, multilayer wiring boards including multi-wiring layers are more important. For tester boards for testing semiconductor devices, it is essential that the wiring layers are multilayered. As a multilayer wiring board, the built-up type, for example, in which fine wirings including insulating layers and conductor layers alternately superposed are formed on one surface or both surfaces of the core substrate is used.

In the bare chip assembly, silicon chips are mounted directly on a printed circuit board of a glass epoxy resin board. The thermal expansion coefficient of silicon chips is about 3.5 ppm/° C., while the thermal expansion coefficient of the glass epoxy resin board is 12-20 ppm/° C. The thermal expansion coefficient of the glass epoxy resin board for silicon chips to be mounted on is so largely different from that of the silicon chips. It is necessary to decrease the thermal expansion coefficient itself of the printed circuit board for silicon chips to be mounted on so as to prevent fatigue breakage, disconnections, etc. due to stresses caused by the thermal expansion coefficient difference.

As means for reducing the thermal expansion coefficient of the printed circuit board, carbon fibers having an about 1.0-20 ppm/K thermal expansion coefficient are used in place of the glass cloth used as the base material of the glass epoxy resin printed circuit board. However, epoxy reins are inexpensive and very universal as an insulation layer material but can usually have a thermal expansion coefficient of above 40 ppm/K including 40 ppm/K even by mixing an inorganic filler to thereby decrease the thermal expansion coefficient. Thus, the use of epoxy resin makes it difficult to sufficiently decrease the thermal expansion coefficient of the printed circuit board.

The background arts of the present invention are disclosed in e.g., Japanese published unexamined patent application No. 2002-084072, Japanese published unexamined patent application No. 2000-236167, Japanese published unexamined patent application No. 2002-100869, and Japanese published unexamined patent application No. 2000-133942.

In order to decrease the thermal expansion coefficient of the wiring boards used for the bare chip assembly, etc., recently, materials of low thermal expansion coefficients, such as carbon fiber, invar, etc., are used as the core materials of the wiring boards. However, many of these low thermal expansion coefficient materials are conductive, as is not the glass epoxy resin board. Accordingly, it is necessary to insulate the conductive core materials from the wirings of plated layers, etc., formed in the through-holes formed in the core material.

In the step of filling the through-holes by the conventional printing, the fillers, such as epoxy resin, etc., often become short. Voids, cracks, etc. are often made in the filler buried in the through-holes. Resultantly, the conductive core materials and the plated layers often short-circuit with each other.

SUMMARY OF THE INVENTION

An object of the present invention is to provide a wiring board having high reliability and a method for fabricating the same, which ensure the insulation between a conductive core material and wiring patterns.

According to one aspect of the present invention, there is provided a wiring board comprising: a plate-shaped conductive core material with a through-hole formed in; a first insulation layer formed on a surface of the conductive core material and on an inside wall of the through-hole; a first wiring formed on the surface of the conductive core material with the first insulation layer formed on; a second wiring formed in the through-hole with the first insulation layer formed in and electrically connected to the first wiring; and a second insulation layer formed between the first insulation layer and the second wiring, or between the inside wall of the through-hole and the first insulation layer.

According to another aspect of the present invention, there is provided a method for fabricating a wiring board comprising the steps of: forming a first through-hole in a plate-shaped conductive core material; forming an insulation layer on a surface of the conductive core material and on an inside wall of the first through-hole; burying an insulating material in the first through-hole with the insulation layer formed in; forming a second through-hole in the insulation material; and forming a first wiring on the surface of the conductive core material with the insulation layer formed on, and a second wiring electrically connected to the first wiring in the second through-hole.

According to further another aspect of the present invention, there is provided a method for fabricating a wiring board comprising the steps of: forming a first through-hole in a plate-shaped conductive core material; burying an insulating material in the first through-hole; forming a second through-hole in the insulating material; forming an insulation layer on a surface of the conductive core material and on an inside wall of the second through-hole; and forming an first wiring on the surface of the conductive core material with the insulation layer formed on, and a second wiring electrically connected to the first wiring in the second through-hole with the insulation layer formed in.

According to the present invention, the insulation layer is formed on the inside wall of the through-hole in the conductive core material, covering burrs, whereby the conductive core material and the wirings can be surely insulated from each other. Accordingly, the present invention can provide a wiring board of high reliability.

According to the present invention, the insulation layer is formed on the inside wall of the through-hole in the conductive core material, covering burrs with the metal layer formed

DETAILED DESCRIPTION OF THE INVENTION

A First Embodiment

Figure 1:
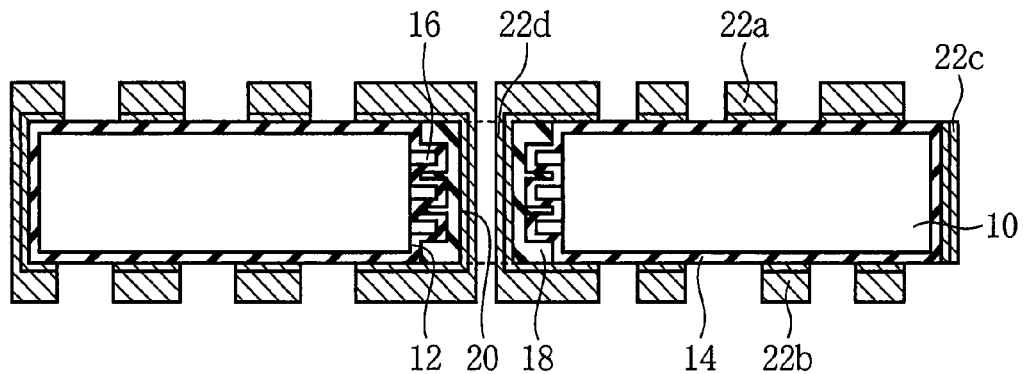
FIG. 1 is a sectional view of the wiring board according to a first embodiment of the present invention, which illustrates a structure thereof.

The wiring board and the method for fabricating the same according to a first embodiment of the present invention will be explained with reference to FIGS. 1, 2A-2C, 3A-3C and 4A-4C. FIG. 1 is a sectional view of the wiring board according to the present embodiment, which illustrates a structure thereof. FIGS. 2A-2C, 3A-3C and 4A-4C are sectional views of the wiring board according to the present embodiment in the steps of the method for fabricating the same, which illustrate the method.

First, the wiring board according to the present embodiment will be explained with reference to FIG. 1.

A through-hole 12 is formed throughout a plate-shaped conductive core material 10 from the upper surface thereof to the undersurface thereof. A prescribed number of through-holes 12 corresponding to an wiring layout or others are formed in the conductive core material 10. Specifically, about 1000 through-holes 12, for example, are formed. The diameter of the through-holes 12 is, e.g., 0.5 mm.

The conductive core material 10 is a resin substrate containing carbon fibers and comprises 5 sheets, for example, of the prepreg (not illustrated) which is a composite of, e.g., a 0.2 mm-carbon fiber sheet and a polyimide-group resin composition, which (the prepregs) are laminated by press. The thickness of the conductive core material 10 is, e.g., 1.0 mm. The carbon sheet is formed of carbon fibers knitted in a sheet. The polyimide-group resin composition containing the carbon fiber sheet is mixed with an inorganic filler, such as alumina filler, aluminum nitride filler, silica filler or others, for decreasing the thermal expansion coefficient.

An insulation layer 14 of a resin of, e.g., a 20 μm-average thickness is formed on the upper surface, the undersurface and the side surfaces of the conductive core material 10 with the through-hole 12 formed therein, and on the inside wall of the through-hole 12. The insulation layer 14 is formed of, e.g., poly-para-xylylene film.

Here, on the inside wall of the through-hole 12 formed in the conductive core material 10, burrs 16 are often formed in opening the through-hole 12. In the burrs 16, the carbon fibers of the conductive core material 10 are often exposed out of the conductive core material 10. The insulation layer 14 is formed, covering the burrs 16 including the carbon fibers exposed out of the conductive core material 10.

A resin 18 is filled in the through-hole 12 with the insulation layer 14 formed on the inside wall. The resin 18 is, e.g., polyimide.

A through-hole 20 is formed throughout the conductive core material 10 from the upper surface to the undersurface substantially at the center of the resin 18 filled in the through-hole 12. The diameter of the through-hole 20 is, e.g., 0.2 mm.

Wirings 22a are formed on the insulation layer 14 formed on the upper surface of the conductive core material 10. Wirings 22b are formed on the insulation layer 14 formed on the undersurface of the conductive core material 10. Wirings 22c are formed on the insulation layer 14 formed on the side surfaces of the conductive core material 10. A wiring 22d is formed on the insulation layer 14 formed on the inside wall of the through-hole 20 formed in the resin 18. The wiring 22d formed on the inside wall of the through-hole 20 electrically interconnects the wiring 22a formed on the upper surface of the conductive core material 10 and the wiring 22b formed on the undersurface of the conductive core material 10 with each other. The wirings 22a-22d are formed of, e.g., copper film. The wirings 22a-22c and the conductive core material 10 are insulated from each other by the insulation layer 14. The wiring 22d and the conductive core material 10 are insulated from each other by the insulation layer 14 and the resin 18.

In FIG. 1, the wirings 22a, 22b of 1 layer alone are formed respectively on the upper surface and the undersurface of the conductive core material 10. On the upper surface and the undersurface of the conductive core material 10, the same wirings as described above are repeatedly formed with the insulation layer formed therebetween. Specifically multilayer wirings of, e.g., 5 layers (not illustrated) are formed. An overcoat layer (not illustrated) is formed on the uppermost layers of the upper surface and the undersurface of the conductive core material 10 with the multilayer wirings formed on.

Thus, the wiring board according to the present embodiment is constituted.

The wiring board according to the present embodiment is characterized mainly in that the insulation layer 14 is formed on the inside wall of the through-hole 12 in the conductive core material 10, covering burrs 16.

The burrs 16 present on the inside wall of the through-hole 12 are covered by the insulation layer 14, whereby the insulation between the conductive core material 10 and the wiring 22d can be ensured. Accordingly, the wiring board can have high reliability.

Next, the method for fabricating the wiring board according to the present embodiment will be explained with reference to FIGS. 2A-2C, 3A-3C and 4A-4C.

First, 5 sheets, for example, of the prepreg prepared by compounding a carbon fiber sheet of carbon fibers knitted in a sheet and a polyimide-group resin composition are superposed one on another and pressed by, e.g., vacuum press. Thus, the plate-shaped conductive core material 10 is prepared. The prepregs may not be pressed essentially by vacuum press and may be pressed by a laminator, such as vacuum laminator or others, laminated sheet pressing machine or others.

Figure 2A:
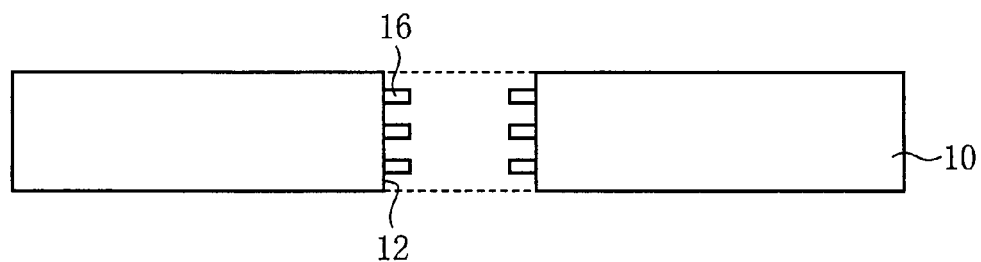
FIGS. 2A-2C, 3A-3C and 4A-4C are sectional views of the wiring board according to the first embodiment of the present invention in the steps of the method for fabricating the same, which illustrate the method.

Then, the through-hole 12 is formed throughout the conductive core material 10 from the upper surface to the undersurface by cutting with, e.g., a drill (see FIG. 2A). The diameter of the through-hole 12 is, e.g., 0.5 mm. The number of the through-holes 12 is, e.g., 1000. This cut often form burrs 16 on the inside wall of the through-hole 12.

Next, prescribed degreasing processing and prescribed cleaning processing are made on the conductive core material 10 with the through-hole 12 formed in.

Figure 2B:
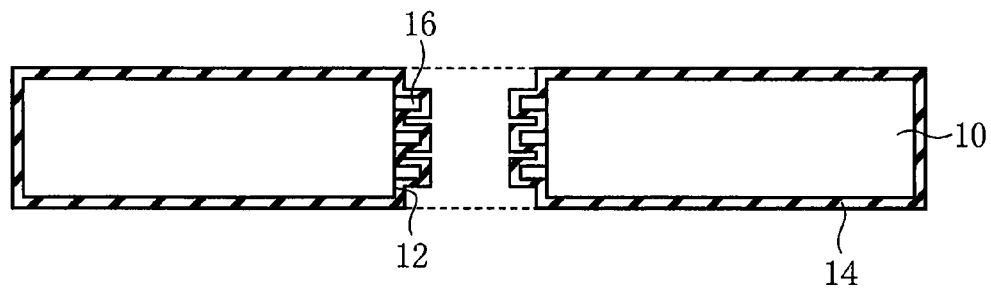
Figure 2C:
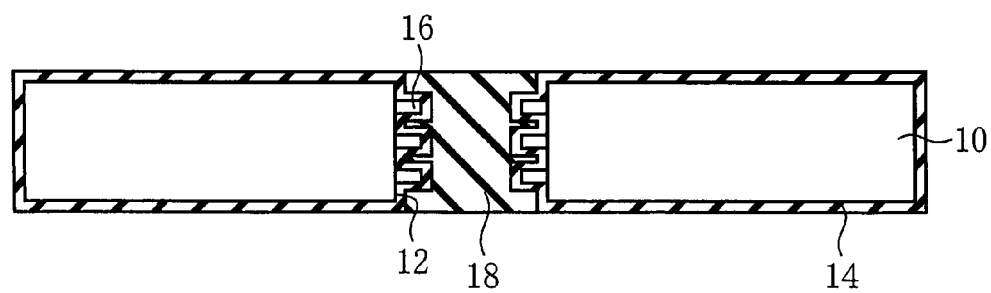

Then, the insulation layer 14 of a poly-para-xylylene film of, e.g., a 20 μm-average thickness is formed by vapor deposition on the entire surface, i.e., the upper surface, the undersurface and the side surfaces of the conductive core material 10, and the inside wall of the through-hole 12 (see FIG. 2B).

As described above, according to the method for fabricating the wiring board according to the present embodiment, the insulation layer 14 is formed by vapor deposition using the raw material in the gas phase, which makes it possible to form the insulation layer 14 of high coverage with less fine pinholes formed in on the upper surface and the undersurface of the conductive core material 10 and also on the inside wall of the through-hole 12. This ensures the insulation between the conductive core material 10, and the wiring 22d, which is to be formed later on the inside wall of the through-hole 12 with the insulation layer 14 formed therebetween.

The poly-para-xylylene film forming the insulation layer 14 can be formed at the room temperature, which permits the insulation layer 14 to be formed without failure without the deterioration, breakage, etc. of the conduction core material 10 even when the conductive core material 10 is formed of a low heat-resistance material. Furthermore, without applying thermal stresses, the insulation layer 14 can be formed, which permits the insulation layer 14 to have small residual stresses. Accordingly, the generation of cracks due to stresses of the insulation layer 14 can be suppressed.

Then, thermoplastic polyimide sheets are laminated by, e.g. vacuum press, on both surfaces of the conductive core material 10 with the insulation layer 14 formed on. The temperature for the lamination by vacuum press is, e.g., 200° C., and the press period of time is, e.g., 30 minutes. The thickness of the laminated thermoplastic polyimide sheets is, e.g., 0.05 mm. The resin 18 of polyimide is thus buried in the through-hole 12 with the insulation layer 14 formed on the inside wall. After the resin 18 has been buried in the through-hole 12, the polyimide remaining on the upper surface and the undersurface of the conductive core material 10 is removed (see FIG. 2C).

Figure 3A:
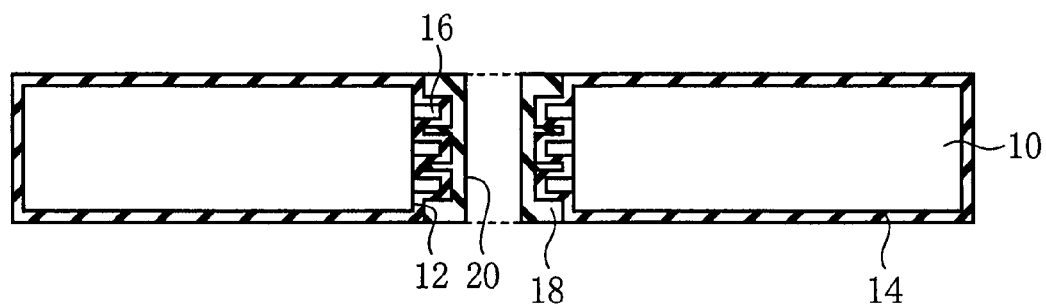

Then, the through-hole 20 is formed throughout the conductive core material 10 from the upper surface to the undersurface substantially at the center of the resin 18 buried in the through-hole 12 (see FIG. 3A). The diameter of the through-hole 20 is, e.g., 0.2 mm. The through-hole 20 is formed by dry etching such as laser dry etching using, e.g., UV-YAG laser, carbon dioxide gas laser, excimer laser or others, or plasma dry etching or others. The through-hole 20 may be formed by cutting using, e.g., a drill.

Figure 3B:
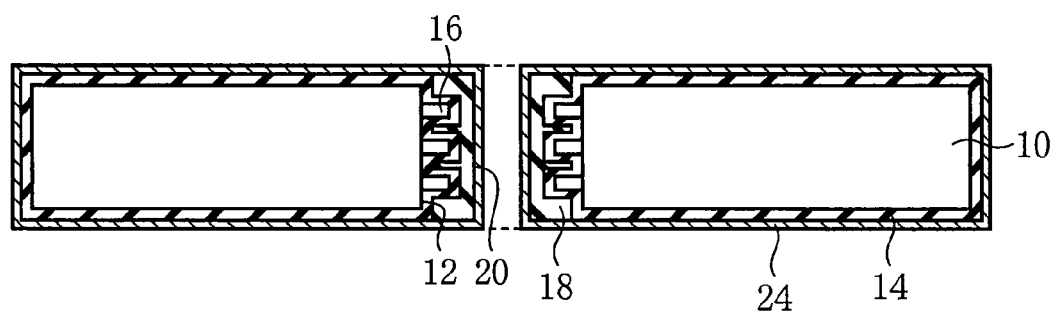
Figure 3C:
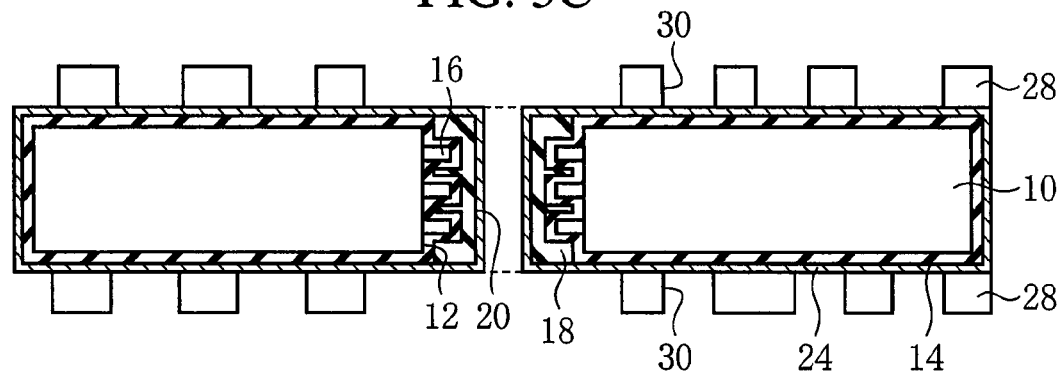

Then, desmearing processing is made on the through-hole 20, and then a copper film 24 of, e.g., a 0.3 μm-thickness is formed by electroless plating on the entire surface, i.e., on the insulation layer 14 formed on the upper surface, the undersurface and the side surfaces of the conductive core material 10, on the resin 18 and on the inside wall of the through-hole 20 (see FIG. 3B).

Then, the conductive core material 10 is laminated by a dry film resist to form a resist layer 28 of, e.g., a 50 μm-thickness on the copper film 24 formed on the upper surface and the undersurface of the conductive core material 10. Next, the openings 30 for exposing the regions for the wirings to be formed in are formed in the resist layer 28 by photolithography (see FIG. 3C).

Figure 4A:
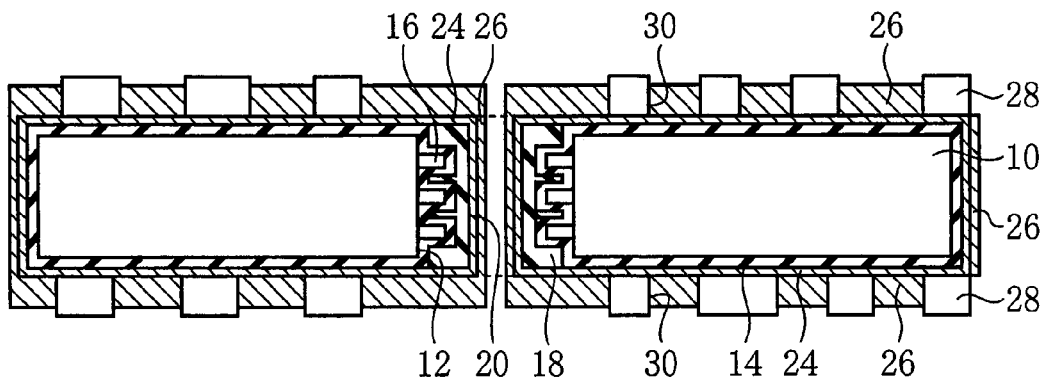

Then, by using as the seed the copper film 24 formed by the electroless plating, a copper film 26 of, e.g., a 30 μm-thickness is formed by electroplating on the copper film 24 exposed in the openings 30 in the resist layer 28 and on the copper film 24 formed on the inside wall of the through-hole 20 (see FIG. 4A).

Figure 4B:
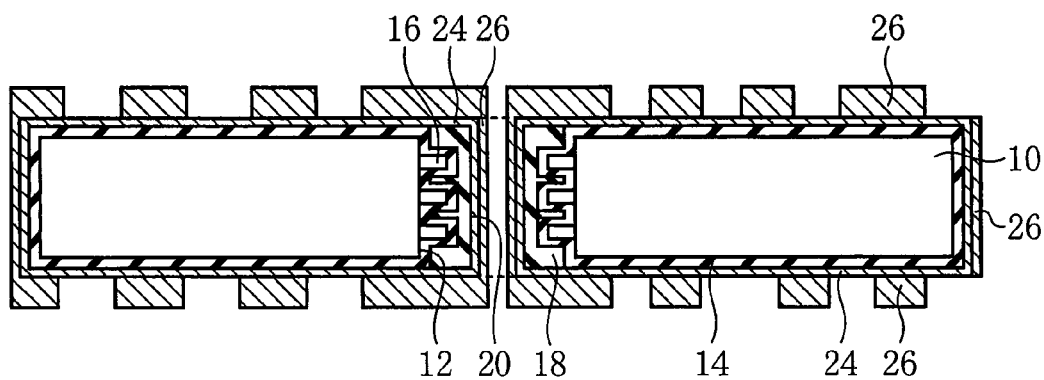
Figure 4C:
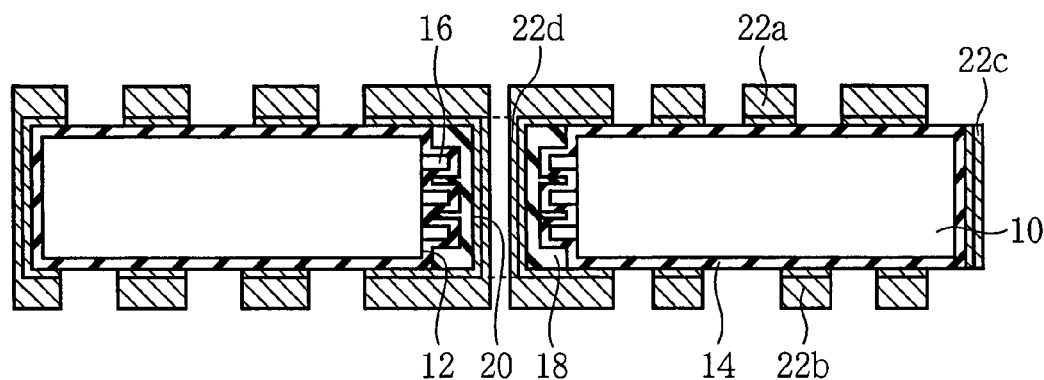

After the copper film 26 has been formed, the resist layer 28 is removed (see FIG. 4B).

Next, with the copper film 26 as the mask, the copper film 24 used as the seed is etched off. The etchant is a mixed liquid of, e.g., aqueous solution of hydrogen peroxide and sulfuric acid. Thus, the wirings 22a, 22b of the copper films 24, 26 are respectively formed on the insulation layer 14 formed on the upper surface and the undersurface of the conductive core material 10. The wirings 22c formed of the copper films 24, 26 are formed on the insulation layer 14 formed on the side surfaces of the conductive core material 10. The wiring 22d formed of the copper films 24, 26 is formed on the inside wall of the through-hole 20 formed in the resin 18 (see FIG. 4C).

Hereafter, the step of forming the insulation layer and the same steps of forming the wirings as described above are repeated to thereby form the multilayer wirings of, e.g., 5 layers (not illustrated) respectively on the upper surface and the undersurface of the conductive core material 10. The overcoat layer (not illustrated) is formed by, e.g., screen printing and photolithography on the uppermost layer on the upper surface and the undersurface of the conductive core material 10 with the multilayer wirings formed on.

Thus, the wiring board according to the present embodiment is formed.

As described above, according to the present embodiment, the insulation layer 14 is formed on the inside wall of the through-hole 12 in the conductive core material 10, covering burrs 16 on the inside wall of the through-hole 12, whereby the conductive core material 10 and the wiring 22d can be surely insulated from each other. Accordingly, the wiring board of high reliability can be provided.

EXAMPLE 1

The conductive core material 10 was 5 sheets of the prepreg which was a composite of a 0.2 mm-carbon fiber sheet and a polyimide-group resin composition, which (the prepregs) were laminated by press in a 1.0 mm-thickness. The polyimide resin composition containing the carbon fiber sheet was mixed with an alumina filler by 10 weight % of the whole composition and a silica filler by 10 weight % of the whole composition. The alumina filler had an average particle diameter of below 7 μm including 7 μm and a 7 ppm/K thermal expansion coefficient. The silica filler had an average particle diameter of below 3 μm including 3 μm and a 3 ppm/K thermal expansion coefficient. The conductive core material 10 formed of these materials had, at 25-200° C., a 2 ppm/K average thermal expansion coefficient in the direction of expansion of the surface and a 80 ppm/K average thermal expansion coefficient in the thickness-wise direction. About 1000 through-holes 12 of a 0.5 mm-diameter were formed in the conductive core material 10. The insulation layer 14 was formed by vapor deposition as follows. First, the conductive core material 10 with the through-holes 12 formed in was placed on the film forming stage in the vapor deposition chamber of a vapor deposition system. In the thermal decomposition chamber of the vapor deposition system, 20 g of di-para-xylylene which is the dimer of the raw material was thermally decomposed under conditions of 510° C. and 25 mTorr to produce diradical para-xylylene. Subsequently, the produced diradical para-xylylene was fed into the vapor deposition chamber and vapor deposited under conditions of a 25° C. substrate temperature and a 30 mTorr vapor deposition chamber internal pressure. The vapor deposition period of time was 6 hours. Thus, the insulation layer 14 of the poly-para-xylylene film of a 20 μm-average film thickness was formed by vapor deposition.

(Control 1)

As a control, a wiring board with a resin 18 buried directly in the through-holes 12 without forming the insulation layer 14 was prepared. Control 1 was the same as Example 1 except that in the former the insulation layer 14 was not formed.

(Evaluation Result)

A temperature cycle test in which 1 cycle of 15 minute-cooling at −65° C. and 15 minute-heating at 125° C. was repeated 1000 times was made on Example 1 and Control 1 described above.

Based on the results of the temperature cycle test, in Example 1, the resistance change percentage at the electrical connections was below +5% including +5%. No crack and peel were observed in the insulation layer 14, the wirings 22d, etc. formed in the through-holes 12. No short circuit due to the intrusion of the plating solution for copper in forming the wirings 22d was observed.

On the other hand, in Control 1, based on the result of the temperature cycle test, short circuit was observed in the wirings 22d at the centers of the through-holes 20.

A Second Embodiment

Figure 5A:
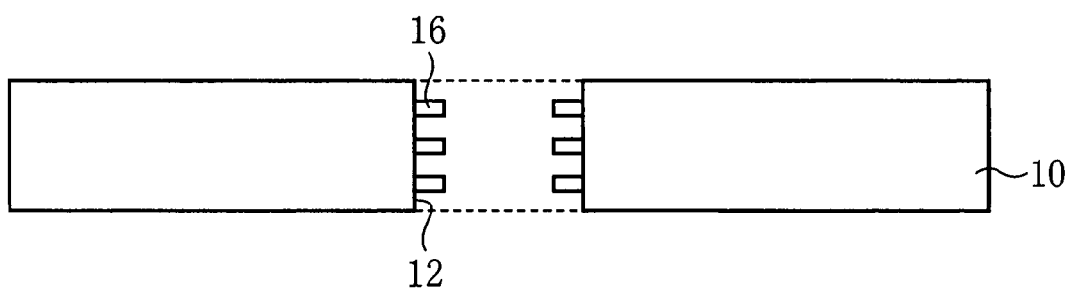
FIGS. 5A-5B are sectional views of the wiring board according to a second embodiment of the present invention in the steps of the method for fabricating the same, which illustrate the method.
Figure 5B:
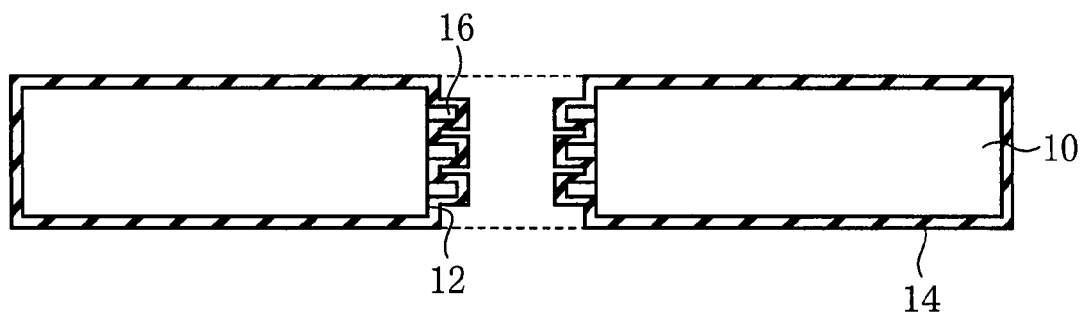

The wiring board and the method for fabricating the same according to a second embodiment of the present invention will be explained with reference to FIGS. 5A-5B. FIGS. 5A-5B are sectional views of the wiring board according to the present embodiment in the steps of the method for fabricating the same. The same members of the present embodiment as the wiring board and the method for fabricating the same according to the first embodiment are represented by the same reference numbers not to repeat or to simplify their explanation.

The structure of the wiring board according to the present embodiment is substantially the same as the wiring board according to the first embodiment. The wiring board according to the present embodiment is different from the wiring board according to the first embodiment in that in the former, an insulation layer 14 is formed by electrodeposition. The method for fabricating the wiring board according to the present embodiment will be explained with reference to FIGS. 5A-5B.

First, in the same way as in the method for fabricating the wiring board according to the first embodiment, a through-hole 12 is formed in a plate-shaped conductive core material 10 (see FIG. 5A).

Next, prescribed degreasing processing and prescribed cleaning processing are performed on the conductive core material 10 with the through-hole 12 formed in.

Next, the insulation layer 14 is formed of a polyimide film of, e.g., a 15 μm-average thickness on the entire surface, i.e., the upper surface, the undersurface and the side surfaces of the conductive core material 10, and the inside wall of the through-hole 12 by electrodeposition with the carbon fibers in the conductive core material 10 as the electrode (see FIG. 5B).

Here, the polyimide forming the insulation layer 14 has already had the heat-resistant imidized molecular structure before electrodeposited on the conductive core material 10. Accordingly, in forming the insulation layer 14 of the polyimide film, no thermal processing step for imidization at about 400° C. is necessary. Thus, even when the heat resistance of the conductive core material 10 is low, the insulation layer 14 can be surely formed without the deterioration, breakage, etc. of the conductive core material 10.

The steps after the insulation layer 14 has been formed are the same as those of the method for fabricating the wiring board according to the first embodiment illustrated in FIGS. 2C to 4C, and their explanation will not be repeated.

As described above, according to the present embodiment, the insulation layer 14 is formed on the inside wall of the through-hole 12 in the conductive core material 10, covering burrs 16, whereby the conductive core material 10 and the wiring 22d can be surely insulation from each other. Accordingly the wiring board can have high reliability.

EXAMPLE 2

The conductive core material 10 was 5 sheets of the prepreg which was a composite of a 0.2 mm-carbon fiber sheet and a polyimide-group resin composition, which (the prepregs) were laminated by press in a 1.0 mm-thickness. The polyimide resin composition containing the carbon fiber sheet was mixed with an alumina filler by 10 weight % of the whole composition and a silica filler by 10 weight % of the whole composition. The alumina filler had an average particle diameter of below 7 μm including 7 μm and a 7 ppm/K thermal expansion coefficient. The silica filler had an average particle diameter of below 3 μm including 3 μm and a 3 ppm/K thermal expansion coefficient. The conductive core material 10 formed of these materials had, at 25-200° C., a 2 ppm/K average thermal expansion coefficient in the direction of expansion of the surface and a 80 ppm/K average thermal expansion coefficient in the thickness-wise direction. About 1000 through-holes 12 of a 0.5 mm-diameter were formed in the conductive core material 10. The insulation layer 14 was formed by electrodeposition as follows. First, the conductive core material 10 was immersed in a polyimide electrodeposition liquid filled in a stainless vessel. A part of the side surfaces of the conductive core material 10, where the carbon fibers are exposed was connected to a direct current source. The conductive core material 10 immersed in the polyimide electrodeposition liquid was charged from the direct current source by constant-current method for 180 seconds under conditions of 50 mA and 5 coulomb and was coated with the polyimide. Then, the conductive core material 10 coated with the polyimide was dried in steps at 90° C. for 30 minutes and sequentially at 180° C. for 30 minutes. Thus, the insulation layer 14 of the polyimide film of a 15 μm-average film thickness was formed by the electrodeposition.

EXAMPLE 3

The conductive core material 10 was 5 sheets of the prepreg which was a composite of a 0.2 mm-carbon fiber sheet and a polyimide-group resin composition, which (the prepregs) were laminated by press in a 1.0 mm-thickness. The polyimide resin composition containing the carbon fiber sheet was mixed with an aluminum nitride filler by 5 weight % of the whole composition and a silica filler by 25 weight % of the whole composition. The aluminum nitride filler had an average particle diameter of below 8 μm including 8 μm and a 5 ppm/K thermal expansion coefficient. The silica filler had an average particle diameter of below 3 μm including 3 μm and a 3 ppm/K thermal expansion coefficient. The conductive core material 10 formed of these materials had, at 25-150° C., a 3 ppm/K average thermal expansion coefficient in the direction of expansion of the surface and a 70 ppm/K average thermal expansion coefficient in the thickness-wise direction. About 1000 through-holes 12 of a 0.5 mm-diameter were formed in the conductive core material 10. The insulation layer 14 was formed by electrodeposition as follows. First, the conductive core material 10 was immersed in a polyimide electrodeposition liquid filled in a stainless vessel. A part of the side surfaces of the conductive core material 10, where the carbon fibers are exposed is connected to a direct current source. The conductive core material 10 immersed in the polyimide electrodeposition liquid was charged from the direct current source by constant-current method for 120 seconds under conditions of 100 V and 10 coulomb and was coated with the polyimide. Then, the conductive core material 10 coated with the polyimide was dried in steps at 90° C. for 30 minutes and sequentially at 180° C. for 30 minutes. Thus, the insulation layer 14 of the polyimide film of a 20 μm-average film thickness was formed by the electrodeposition.

(Controls 2 and 3)

As controls, wiring boards each with the resin 18 buried directly in the through-holes 12 without forming the insulation layer 14 were prepared. Controls 2 and 3 were the same as Examples 2 and 3 except that in the former the insulation layer 14 was not formed.

(Evaluation Result)

A temperature cycle test in which 1 cycle of 15 minute-cooling at −65° C. and 15 minute-heating at 125° C. was repeated 1000 times was made on Examples 2 and 3 and Controls 2 and 3 described above.

Based on the results of the temperature cycle test, in Examples 2 and 3, the resistance change percentage at the electrical connections was below +5% including +5%. No crack and peel were observed in the insulation layer 14, the wirings 22d, etc. formed in the through-holes 12. No short circuit due to the intrusion of the plating solution for copper in forming the wirings 22d was observed.

On the other hand, in Controls 2 and 3, based on the result of the temperature cycle test, short circuit was observed in the wirings 22d at the centers of the through-holes 20.

A Third Embodiment

Figure 6:
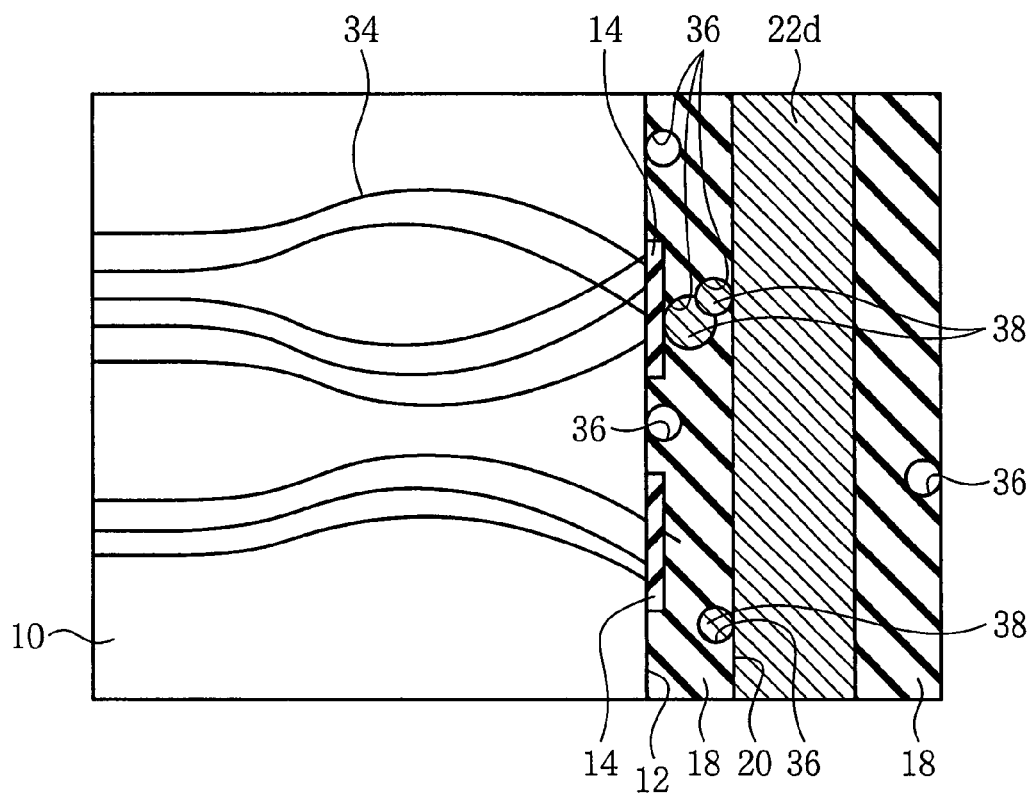
FIG. 6 is a sectional view of a state of a through-hole and its surroundings with the insulation layer formed by electrodeposition.
Figure 7:
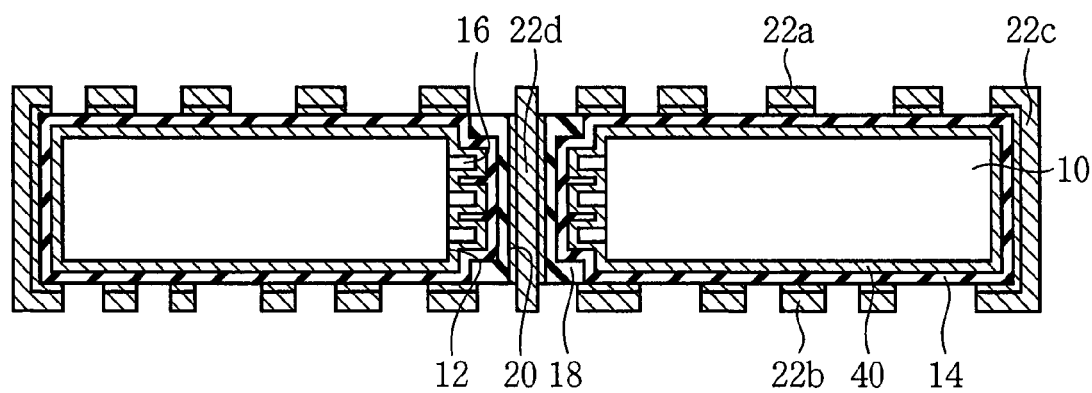
FIG. 7 is a sectional view of the wiring board according to a third embodiment of the present invention, which illustrates a structure thereof.

The wiring board and the method for fabricating the same according to a third embodiment of the present invention will be explained with reference to FIGS. 6, 7, 8A-8C, 9A-9C and 10A-10C. FIG. 6 is a sectional view of the wiring board, which illustrates a through-hole and its surroundings when an insulation layer is formed by electrodeposition. FIG. 7 is a sectional view of the wiring board according to the present embodiment, which illustrates a structure thereof. FIGS. 8A-8C, 9A-9C and 10A-10C are sectional views of the wiring board according to the present embodiment in the steps of the method for fabricating the same, which illustrate the method. The same members of the present embodiment as those of the wiring board and the method for fabricating the same according to the first embodiment are represented by the same reference numbers not to repeat or to simplify their explanation.

The wiring board according to the present embodiment is characterized mainly by a metal layer formed by plating between the insulation layer 14 and the conductive core material 10.

When the insulation layer 14 is formed by electrodeposition, as in the method for fabricating the wiring board according to the second embodiment, there is a possibility that the conductive core material 10 and the wiring 22d might be short-circuited due to burrs present on the inside wall of the through-hole 12.

In forming the conductive layer 14 of polyimide film by electrodeposition, as illustrated in FIG. 6, the insulation layer 14 is formed on the inside wall of the through-hole 12 at parts of the conductive core material 10, where the carbon fibers 34 of high conductivity are exposed but is not sufficiently formed at resin parts of the conductive core material 10, whose conductivity is low. At such time, there is a risk that all the carbon fiber 34 might not be coated with the insulation layer 14.

In the resin 18 buried in the through-hole 12, voids 36 are formed due to air bubbles, etc. mixed in the resin 18 at the time of burying the resin 18. When the through-hole 20 is formed in the resin 18 in such state, and the wiring is formed by plating, the wiring material intrudes into the voids 36 in the resin 18, and metal masses 38 of the wiring material are formed in the voids 36. When such metal masses 38 are formed in contact with the carbon fibers 34 which are not completely coated with the insulation layer 14, short circuit takes place between the conductive core material 10 and the wiring 22d.

The wiring board according to the present embodiment can prevent the occurrence of such short circuit. The wiring board according to the present embodiment will be explained with reference to FIG. 7.

The through-hole 12 is formed throughout the plate-shaped conductive core material 10 from the upper surface to the undersurface. A prescribed number of the through-holes 12 corresponding to an wiring layout, etc. are formed. Specifically, about 1000 through-holes 12, for example, are formed. The diameter of the through-holes 12 is, e.g., 0.5 mm.

The conductive core material 10 is a resin substrate containing carbon fibers and comprises 5 sheets, for example, of the prepreg (not illustrated) which is a composite of, e.g., a 0.2 mm-carbon fiber sheet and a polyimide-group resin composition, which (the prepregs) are laminated by press. The thickness of the conductive core material 10 is, e.g., 1.0 mm. The carbon sheet is formed of carbon fibers knitted in a sheet. The polyimide-group resin composition containing the carbon fiber sheet is mixed with an inorganic filler, such as alumina filler, aluminum nitride filler, silica filler or others, for decreasing the thermal expansion coefficient.

A metal layer 40 of a copper film of, e.g., a 30 μm-thickness is formed on the upper surface, the undersurface and the side surfaces of the conductive core material 10 with the through-hole 12 formed in and on the inside wall of the through-hole 12.

Here, burrs 16 formed when the through-hole 12 was opened are present on the inside wall of the through-hole 12 formed in the conductive core material 10. On the burrs 16, the carbon fibers of the conductive core material 10 are often exposed out of the conductive core material 10. The metal layer 40 is formed, covering the burrs 16 containing the carbon fibers exposed out of the conductive core material 10.

The insulation layer 14 of a resin of, e.g., a 20 μm-average film thickness is formed on metal layer 40 formed on the upper surface, the undersurface and the side surfaces of the conductive core material 10 and on the inside wall of the through-hole 12. The insulation layer 14 is, e.g., poly-para-xylylene film.

The resin 18 is buried in the through-hole 12 with the insulation layer 14 formed on the inside wall. The resin 18 is, e.g., polyimide.

A through-hole 20 is formed throughout the conductive core material 10 from the upper surface to the undersurface substantially at the center of the resin 18 buried in the through-hole 12. The diameter of the through-hole 20 is, e.g., 0.2 mm.

Wirings 22a are formed on the insulation layer 14 formed on the upper surface of the conductive core material 10. Wirings 22b are formed on the insulation layer 14 formed on the undersurface of the conductive core material 10. Wirings 22c are formed on the insulation layer 14 formed on the side surfaces of the conductive core material 10. A wiring 22d is formed in the through-hole 20 formed in the resin 18. The wiring 22d formed in the through-hole 20 electrically interconnects the wirings 22a formed on the upper surface of the conductive core material 10 and the wirings 22b formed on the undersurface of the conductive core material 10. The wirings 22a-22d are formed of, e.g., copper film. The wirings 22a-22c, and the conductive core material 10 are insulated from each other by the insulation layer 14. The wiring 22d and the conductive core material 10 are insulated from each other by the insulation layer 14 and the resin 18.

In FIG. 7, the wirings 22a, 22b of 1 layer alone are formed respectively on the upper surface and the undersurface of the conductive core material 10. On the upper surface and the undersurface of the conductive core material 10, the same wirings as described above are repeatedly formed with the insulation layer formed therebetween. Specifically multilayer wirings of, e.g., 5 layers (not illustrated) are formed. An overcoat layer (not illustrated) is formed on the uppermost layers of the upper surface and the undersurface of the conductive core material 10 with the multilayer wirings formed on.

Thus, the wiring board according to the present embodiment is constituted.

In the wiring board according to the present embodiment, as described above, the metal layer 40 is formed on the inside wall of the through-hole 12, on which burrs 16 have been formed in opening the through-holes 12, which reduces the surface roughness of the inside wall of the through-hole 12. Because of the insulation layer 14 formed on the inside wall of the through-holes 12 having the surface roughness reduced by the metal layer 40, the insulation layer 14 is formed with higher adhesion in comparison with the insulation layer 14 of the wiring board according to the first and the second embodiments. Such insulation layer 14 can more surely insulate the conductive core material 10 and the wiring 22d from each other. Thus, the wiring board can have higher reliability.

In the wiring board according to the present embodiment, the wiring structure in the through-hole 12 is coaxial. That is, the wiring 22d is surrounded by the metal layer 40. This can improve the radio-frequency characteristics of the wiring board.

Next, the method for fabricating the wiring board according to the present embodiment will be explained with reference to FIGS. 8A-8C, 9A-9C and 10A-10C.

Figure 8A:
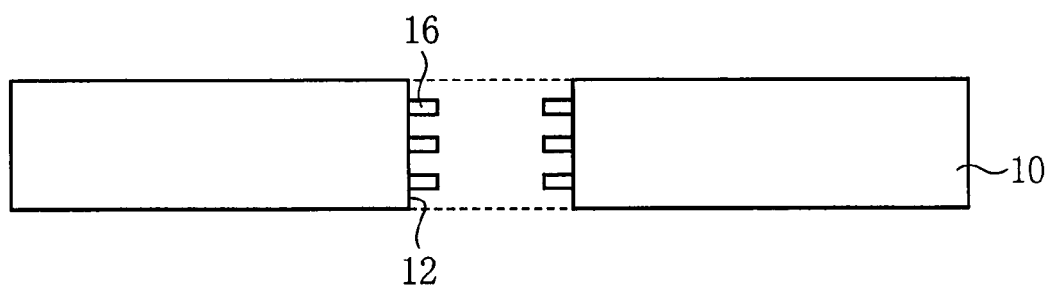
FIGS. 8A-8C, 9A-9C and 10A-10C are sectional views of the wiring board according to the third embodiment of the present invention in the steps of the method for fabricating the same, which illustrate the method.

First, in the same way as in the method for fabricating the wiring board according to the first embodiment, a through-hole 12 is formed throughout the conductive core material 10 from the upper surface to the undersurface (see FIG. 8A).

Next, prescribed degreasing processing and prescribed cleaning processing are made on the conductive core material 10 with the through-hole 12 formed in.

Next, a copper film of, e.g., a 0.3 μm-thickness is formed by, e.g., electroless plating on the entire surface, i.e., the upper surface, the undersurface and the side surfaces of the conductive core material 10, and on the inside wall of the through-hole 12.

Then, a copper film of, e.g., a 30 μm-thickness is further formed on the upper surface, the undersurface and the side surfaces of the conductive core material 10 and on the inside wall of the through-hole 12 by electroplating using as the seed the copper film formed by electroless plating. Thus, the metal layer 40 of the copper film of, e.g., a 30 μm-thickness is formed on the upper surface, the undersurface and the side surfaces of the conductive core material 10 and on the inside wall of the through-hole 12 (see FIG. 8B).

After the metal layer 40 has been formed, prescribed processing may be made to thereby form concavities and convexities in the surface of the metal layer 40 so as to increase the surface roughness of the metal layer 40. This permits the insulation layer 14, etc. to be formed in the through-hole 12 in later steps with high adhesion. For example, the surface of the metal layer 40 is chemically removed by several μm by soft etching using an acid solution, such as sulfuric acid, hydrogen peroxide aqueous solution or others to thereby form concavities and convexities in the surface of the metal layer 40. Concavities and convexities may be formed in the surface of the metal layer 40 by physically polishing the surface of the metal layer 40 with a brush, a grind stone or others.

Figure 8B:
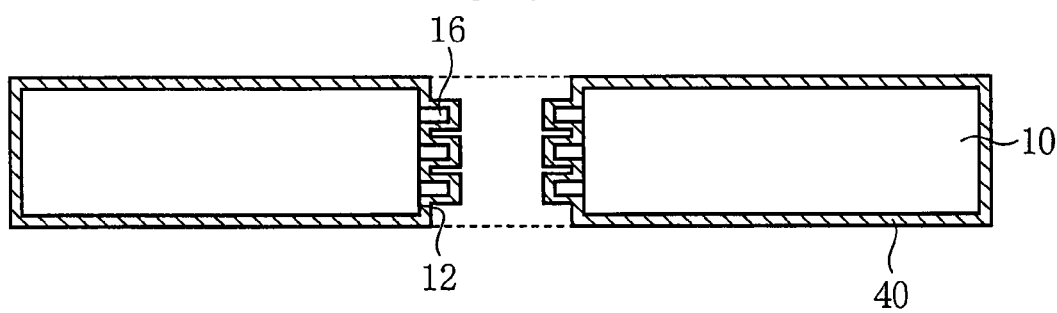
Figure 8C:
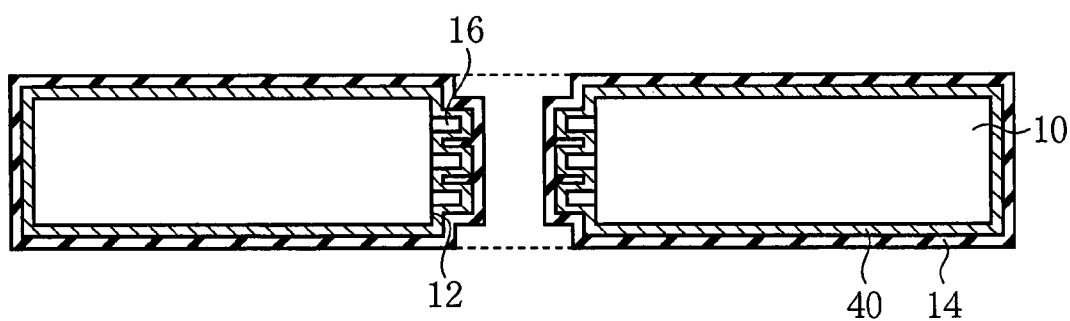

Then, an insulation layer 14 of a poly-para-xylylene film of, e.g., a 20 μm-average film thickness is formed by vapor deposition on the entire surface, i.e., on the metal layer 40 formed on the upper surface, the undersurface, the side surfaces of the conductive core material 10 and on the inside wall of the through-holes 12 (see FIG. 8C).

As described above, according to the method for fabricating the wiring board according to the present embodiment, the insulation layer 14 is formed by vapor deposition using the raw material in the gas phase, which makes it possible to form the insulation layer 14 of high coverage with less fine pinholes formed in on the upper surface and the undersurface of the conductive core material 10 and also on the inside wall of the through-hole 12. This ensures the insulation between the conductive core material 10, and the wiring 22d, which is to be formed later on the inside wall of the through-hole 12 with the insulation layer 14 formed therebetween.

The poly-para-xylylene film forming the insulation layer 14 can be formed at the room temperature, which permits the insulation layer 14 to be formed without failure without the deterioration, breakage, etc. of the conduction core material 10 even when the conductive core material 10 is formed of a low heat-resistance material. Furthermore, without applying thermal stresses, the insulation layer 14 can be formed, which permits the insulation layer 14 to have small residual stresses. Accordingly, the generation of cracks due to stresses of the insulation layer 14 can be suppressed.

Then, thermoplastic polyimide sheets are laminated by, e.g. vacuum press, on both surfaces of the conductive core material 10 with the insulation layer 14 formed on. The temperature for the lamination by vacuum press is, e.g., 200° C., and the press period of time is, e.g., 30 minutes. The thickness of the laminated thermoplastic polyimide sheets is, e.g., 0.05 mm. The resin 18 of polyimide is thus buried in the through-hole 12 with the insulation layer 14 formed on the inside wall. After the resin 18 has been buried in the through-hole 12, the polyimide remaining on the upper surface and the undersurface of the conductive core material 10 is removed (see FIG. 9A).

Figure 9A:
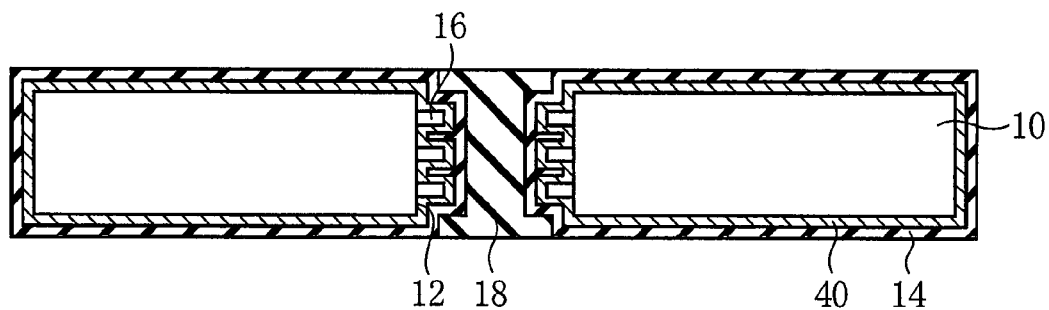
Figure 9B:
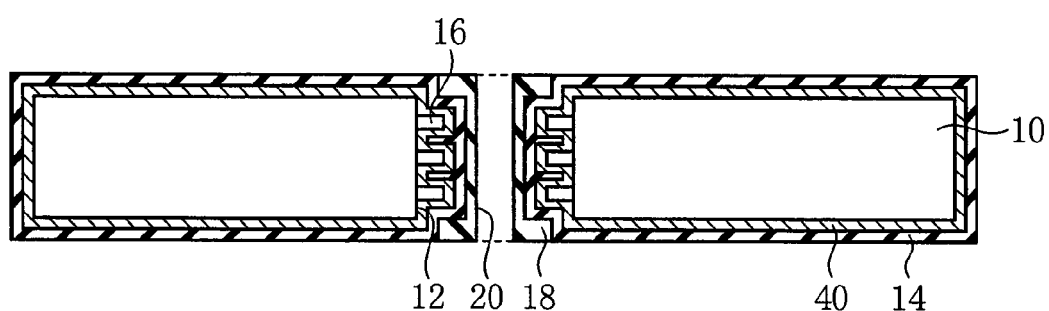
Figure 9C:
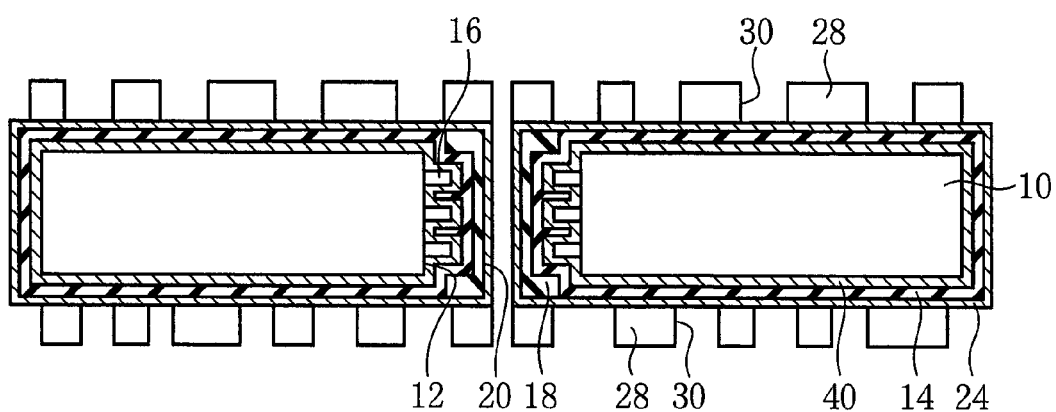

Then, the through-hole 20 is formed throughout the conductive core material 10 from the upper surface to the undersurface substantially at the center of the resin 18 buried in the through-hole 12 (see FIG. 9B). The diameter of the through-hole 20 is, e.g., 0.2 mm. The through-hole 20 is formed by dry etching such as laser dry etching using, e.g., UV-YAG laser, carbon dioxide gas laser, excimer laser or others, or plasma dry etching or others. The through-hole 20 may be formed by cutting using, e.g., a drill.

Then, desmearing processing is made on the through-hole 20, and then a copper film 24 of, e.g., a 0.3 μm-thickness is formed by electroless plating on the entire surface, i.e., on the insulation layer 14 formed on the upper surface, the undersurface and the side surfaces of the conductive core material 10, on the resin 18 and on the inside wall of the through-hole 20.

Then, the conductive core material 10 is laminated by a dry film resist to form a resist layer 28 of, e.g., a 50 μm-thickness on the copper film 24 formed on the upper surface and the undersurface of the conductive core material 10. Next, openings 30 for exposing the regions for the wirings to be formed in are formed in the resist layer 28 by photolithography (see FIG. 9C).

Figure 10A:
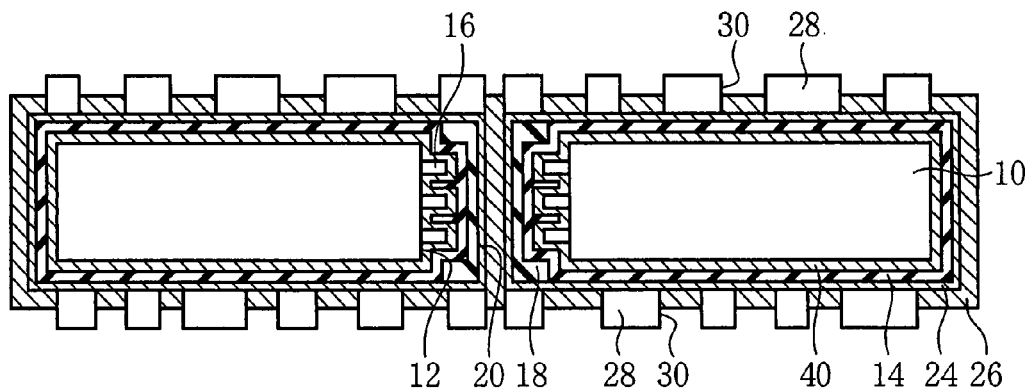

Then, by using as the seed the copper film 24 formed by the electroless plating, a copper film 26 of, e.g., a 30 μm-thickness is formed by electroplating on the copper film 24 exposed in the openings 30 in the resist layer 28 and on the copper film 24 formed on the inside wall of the through-hole 20 (see FIG. 10A).

Figure 10B:
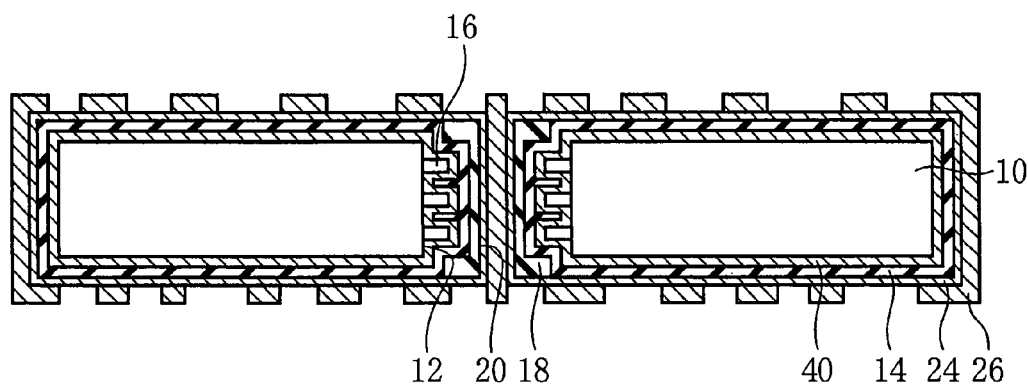
Figure 10C:
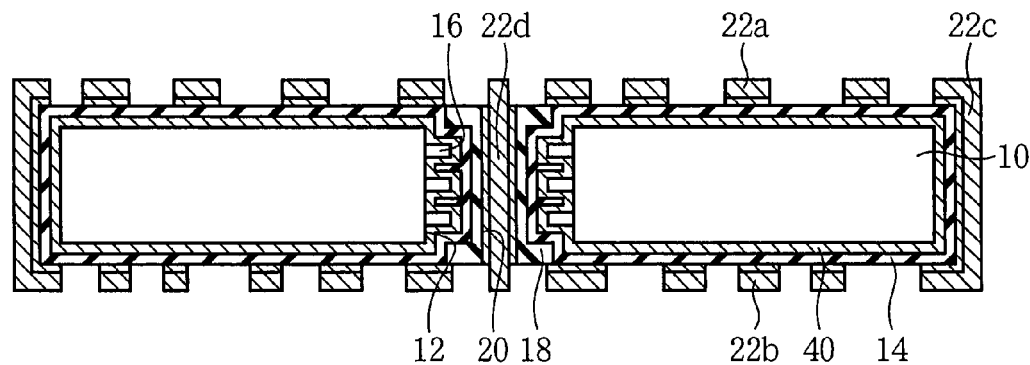

After the copper film 26 has been formed, the resist layer 28 is removed (see FIG. 10B).

Next, with the copper film 26 as the mask, the copper film 24 used as the seed is etched off. The etchant is a mixed liquid of, e.g., aqueous solution of hydrogen peroxide and sulfuric acid. Thus, the wirings 22a, 22b of the copper films 24, 26 are respectively formed on the insulation layer 14 formed on the upper surface and the undersurface of the conductive core material 10. The wirings 22c formed of the copper films 24, 26 are formed on the insulation layer 14 formed on the side surfaces of the conductive core material 10. The wiring 22d formed of the copper films 24, 26 is formed in the through-hole 20 formed in the resin 18 (see FIG. 10C).

Hereafter, the step of forming the insulation layer and the same steps of forming the wirings as described above are repeated to thereby form the multilayer wirings of, e.g., 5 layers (not illustrated) respectively on the upper surface and the undersurface of the conductive core material 10. The overcoat layer (not illustrated) is formed by, e.g., screen printing and photolithography on the uppermost layer on the upper surface and the undersurface of the conductive core material 10 with the multilayer wirings formed on.

Thus, the wiring board according to the present embodiment is formed.

As described above, according to the present embodiment, the insulation layer 14 is formed on the inside wall of the through-hole 12 in the conductive core material 10, covering burrs 16 with the metal layer 40 formed therebetween, which allows the insulation layer 14 to be formed with higher adhesion. Thus, the conductive core material 10 and the wiring 22d can be more surely insulated from each other. Accordingly, the wiring board of higher reliability can be provided.

EXAMPLE 4

The conductive core material 10 was 5 sheets of the prepreg which was a composite of a 0.2 mm-carbon fiber sheet and a polyimide-group resin composition, which (the prepregs) were laminated by press in a 1.0 mm-thickness. The polyimide resin composition containing the carbon fiber sheet was mixed with an alumina filler by 10 weight % of the whole composition and a silica filler by 10 weight % of the whole composition. The alumina filler had an average particle diameter of below 7 μm including 7 μm and a 7 ppm/K thermal expansion coefficient. The silica filler had an average particle diameter of below 3 μm including 3 μm and a 3 ppm/K thermal expansion coefficient. The conductive core material 10 formed of these materials had, at 25-200° C., a 2 ppm/K average thermal expansion coefficient in the direction of expansion of the surface and a 80 ppm/K average thermal expansion coefficient in the thickness-wise direction. About 1000 through-holes 12 of a 0.5 mm-diameter were formed in the conductive core material 10. The insulation layer 14 was formed by vapor deposition as follows. First, the conductive core material 10 with the through-holes 12 formed in was placed on the film forming stage in the vapor deposition chamber of a vapor deposition system. In the thermal decomposition chamber of the vapor deposition system, 20 g of di-para-xylylene which is the dimer of the raw material was thermally decomposed under conditions of 510° C. and 25 mTorr to produce diradical para-xylylene. Subsequently, the produced diradical para-xylylene was fed into the vapor deposition chamber and vapor deposited under conditions of a 25° C. substrate temperature and a 30 mTorr vapor deposition chamber internal pressure. The vapor deposition period of time was 6 hours. Thus, the insulation layer 14 of the poly-para-xylylene film of a 20 μm-average film thickness was formed by vapor deposition.

EXAMPLE 5

The conductive core material 10 was 5 sheets of the prepreg which was a composite of a 0.2 mm-carbon fiber sheet and a polyimide-group resin composition, which (the prepregs) were laminated by press in a 1.0 mm-thickness. The polyimide resin composition containing the carbon fiber sheet was mixed with an aluminum nitride filler by 5 weight % of the whole composition and a silica filler by 25 weight % of the whole composition. The aluminum nitride filler had an average particle diameter of below 8 μm including 8 μm and a 5 ppm/K thermal expansion coefficient. The silica filler had an average particle diameter of below 3 μm including 3 μm and a 3 ppm/K thermal expansion coefficient. The conductive core material 10 formed of these materials had, at 25-150° C., a 3 ppm/K average thermal expansion coefficient in the direction of expansion of the surface and a 70 ppm/K average thermal expansion coefficient in the thickness-wise direction. About 1000 through-holes 12 of a 0.5 mm-diameter were formed in the conductive core material 10. The insulation layer 14 was formed by vapor deposition as follows. First, the conductive core material 10 with the through-holes 12 formed in was placed on the film forming stage in the vapor deposition chamber of a vapor deposition system. In the thermal decomposition chamber of the vapor deposition system, 30 g of di-para-xylylene which is the dimer of the raw material was thermally decomposed under conditions of 500° C. and 20 mTorr to produce diradical para-xylylene. Subsequently, the produced diradical para-xylylene was fed into the vapor deposition chamber and vapor deposited under conditions of a 25° C. substrate temperature and a 50 mTorr vapor deposition chamber internal pressure. The vapor deposition period of time was 4.5 hours. Thus, the insulation layer 14 of the poly-para-xylylene film of a 25 μm-average film thickness was formed by vapor deposition.

(Controls 4 and 5)

As controls, wiring boards each with the resin 18 buried directly in the through-holes 12 without forming the insulation layer 14 were prepared. Controls 4 and 5 were the same as Examples 4 and 5 except that in the former the insulation layer 14 was not formed.

(Evaluation Result)

A temperature cycle test in which 1 cycle of 15 minute-cooling at −65° C. and 15 minute-heating at 125° C. was repeated 1000 times was made on Examples 4 and 5 and Controls 4 and 5 described above.

Based on the results of the temperature cycle test, in Examples 4 and 5, the resistance change percentage at the electrical connections was below +5% including +5%. No crack and peel were observed in the metal layer 40, the insulation layer 14, the wirings 22*d*, etc. formed in the through-holes 12. No short circuit due to the intrusion of the plating solution for copper in forming the wirings 22*d* was observed.

On the other hand, in Control 4 and 5, based on the result of the temperature cycle test, short circuit was observed in the wirings 22*d* at the centers of the through-holes 20.

A Fourth Embodiment

Figure 11A:
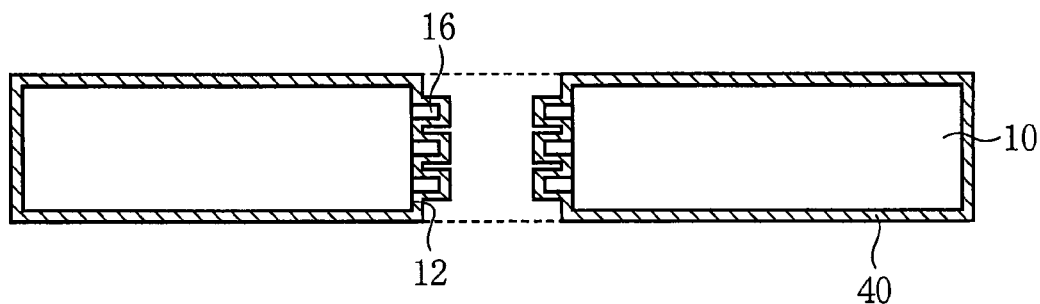
FIGS. 11A-11B are sectional views of the wiring board according to a fourth embodiment of the present invention in the steps of the method for fabricating the same, which illustrate the method.
Figure 11B:
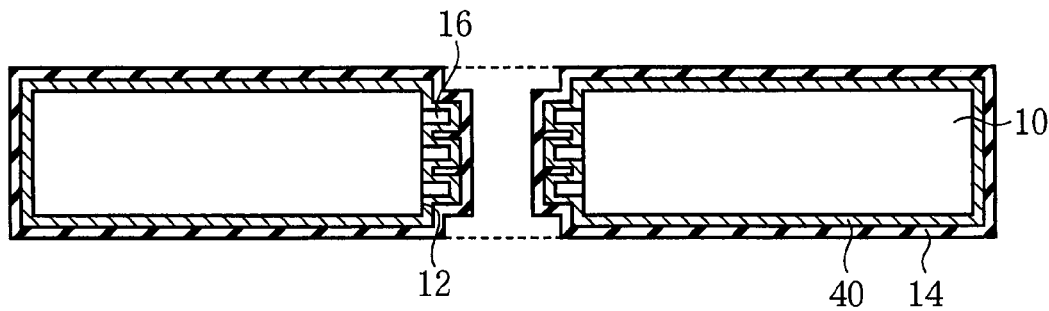

The wiring board and the method for fabricating the same according to a fourth embodiment of the present invention will be explained with reference to FIGS. 11A-11B. FIGS. 11A-11B are sectional views of the wiring board according to the present embodiment in the steps of the method for fabricating the same, which illustrate the method. The same members of the present embodiment as those of the wiring board and the method for fabrication the same according to the first to the third embodiments are represented by the same reference numbers not to repeat or to simplify their explanation.

The structure of the wiring board according to the present embodiment is substantially the same as those of the wring substrate according to the third embodiment. The wiring board according to the present embodiment is different from the wiring board according to the third embodiment in that in the former, an insulation layer 14 is formed by electrodeposition. The method for fabricating the wiring board according to the present embodiment will be explained with reference to FIGS. 11A-11B.

First, in the same way as in the method for fabricating the wiring board according to the third embodiment illustrated in FIGS. 8A-8B, the structure including the metal layer 40 is formed on the upper surface, the undersurface and the side surfaces of a conductive core material 10 and on the inside wall of a through-hole 12 (see FIG. 11A).

Next, on the entire surface, i.e., on the metal layer 40 formed on the upper surface, the undersurface and the side surfaces of the conductive core material 10 and on the inside wall of a through-hole 12, an insulation layer 14 of a polyimide film of, e.g., a 20 μm-average film thickness is formed by electrodeposition using the metal layer 40 as the electrode (see FIG. 11B).

Here, the polyimide forming the insulation layer 14 has already had the heat-resistant imidized molecular structure before electrodeposited on the conductive core material 10. Accordingly, in forming the insulation layer 14 of the polyimide film, no thermal processing step for imidization at about 400° C. is necessary. Thus, even when the heat resistance of the conductive core material 10 is low, the insulation layer 14 can be surely formed without the deterioration, breakage, etc. of the conductive core material 10.

The steps following the formation of the insulation layer 14 are the same as those of the method for fabricating the wiring board according to the third embodiment illustrated in FIGS. 9A to 10C, and their explanation will not be repeated.

As described above, according to the present embodiment, the insulation layer 14 is formed on the inside wall of the through-hole 12 in the conductive core material 10, covering burrs 16 with the metal layer 40 formed therebetween, which allows the insulation layer 14 to be formed with higher adhesion. Thus, the conductive core material 10 and the wiring 22*d* can be more surely insulated from each other. Accordingly, the wiring board of higher reliability can be provided.

EXAMPLE 6

The conductive core material 10 was 5 sheets of the prepreg which was a composite of a 0.2 mm-carbon fiber sheet and a polyimide-group resin composition, which (the prepregs) were laminated by press in a 1.0 mm-thickness. The polyimide resin composition containing the carbon fiber sheet was mixed with an aluminum nitride filler by 5 weight % of the whole composition and a silica filler by 25 weight % of the whole composition. The aluminum nitride filler had an average particle diameter of below 8 μm including 8 μm and a 5 ppm/K thermal expansion coefficient. The silica filler had an average particle diameter of below 3 μm including 3 μm and a 3 ppm/K thermal expansion coefficient. The conductive core material 10 formed of these materials had, at 25-150° C., a 3 ppm/K average thermal expansion coefficient in the direction of expansion of the surface and a 70 ppm/K average thermal expansion coefficient in the thickness-wise direction. About 1000 through-holes 12 of a 0.5 mm-diameter were formed in the conductive core material 10. The insulation layer 14 was formed by electrodeposition as follows. First, the conductive core material 10 was immersed in a polyimide electrodeposition liquid filled in a stainless vessel. Then, the conductive core material 10 was connected to a direct current source at the metal layer 40 formed on the side surfaces of the conductive core material 10. The conductive core material 10 immersed in the polyimide electrodeposition liquid was charged from the direct current source by constant-current method for 120 seconds under conditions of 100 V and 10 coulomb and was coated with the polyimide. Then, the conductive core material 10 coated with the polyimide was dried in steps at 90° C. for 30 minutes and sequentially at 180° C. for 30 minutes. Thus, the insulation layer 14 of the polyimide film of a 20 μm-average film thickness was formed by the electrodeposition.

(Control 6)

As a control, a wiring board with the resin 18 buried directly in the through-holes 12 without forming the insulation layer 14 was prepared. Control 6 was the same as Example 6 except that in the former the insulation layer 14 was not formed.

(Evaluation Result)

A temperature cycle test in which 1 cycle of 15 minute-cooling at −65° C. and 15 minute-heating at 125° C. was repeated 1000 times was made on Example 6 and Control 6 described above.

Based on the results of the temperature cycle test, in Example 6, the resistance change percentage at the electrical connections was below +5% including +5%. No crack and peel were observed in the metal layer 40, the insulation layer 14, the wirings 22d, etc. formed in the through-holes 12. No short circuit due to the intrusion of the plating solution for copper in forming the wirings 22d was observed.

On the other hand, in Control 6, based on the result of the temperature cycle test, short circuit was observed in the wirings 22d at the centers of the through-holes 20.

A Fifth Embodiment

Figure 12:
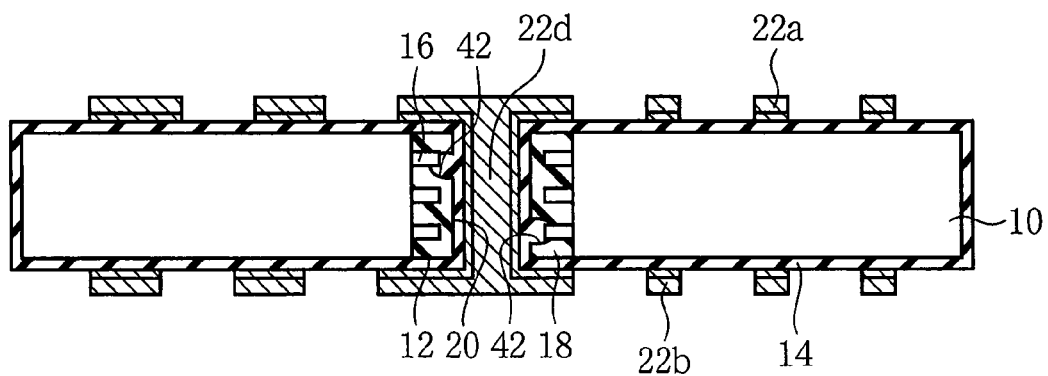
FIG. 12 is a sectional view of the wiring board according to a fifth embodiment of the present invention, which illustrates a structure thereof.

The wiring board and the method for fabricating the same according to a fifth embodiment of the present invention will be explained with reference to FIGS. 12, 13A-13C, 14A-14C and 15A-15B. FIG. 12 is a sectional view of the wiring board according to the present embodiment, which illustrates a structure thereof. FIGS. 13A-13C, 14A-14C and 15A-15B are sectional views of the wiring board according to the present embodiment in the steps of the method for fabricating the same, which illustrate the method. The same members of the present embodiment as those of the wiring board and the method for fabricating the same according to the first to the fourth embodiment are represented by the same reference numbers not to repeat or to simplify their explanation.

The wiring board according to the present embodiment is different from the wiring board according to the first to the fourth embodiments in that in the former, through-hole 12 formed in the conductive core material 10 is filled with a resin 18 before an insulation layer 14 is formed.

The wiring board according to the present embodiment will be explained with reference to FIG. 12.

A through-hole 12 is formed throughout a plate-shaped conductive core material 10 from the upper surface thereof to the undersurface thereof. A prescribed number of the through-holes 12 corresponding to a wiring layout or others are formed in the conductive core material 10. Specifically, about 1000 through-holes 12, for example, are formed. The diameter of the through-holes 12 is, e.g., 0.5 mm.

The conductive core material 10 is a resin substrate containing carbon fibers and comprises 5 sheets, for example, of the prepreg (not illustrated) which is a composite of, e.g., a 0.2 mm-carbon fiber sheet and a polyimide-group resin composition, which (the prepregs) are laminated by press. The thickness of the conductive core material 10 is, e.g., 1.0 mm. The carbon sheet is formed of carbon fibers knitted in a sheet. The polyimide-group resin composition containing the carbon fiber sheet is mixed with an inorganic filler, such as alumina filler, aluminum nitride filler, silica filler or others, for decreasing the thermal expansion coefficient.

A resin 18 is buried in the through-hole 12. The resin 18 is, e.g., polyimide. Burrs 16 present on the inside wall of the through-hole 12 are coated with the resin 18.

A through-hole 20 is formed throughout the conductive core material 10 from the upper surface to the undersurface substantially at the center of the resin 18 buried in the through-hole 12. The diameter of the through-hole 20 is, e.g., 0.2 mm.

An insulation layer 14 of a resin of, e.g., a 20 μm-average film thickness is formed on the upper surface, the undersurface and the side surfaces of the conductive core material 10, on the resin 18 and on the inside wall of the through-hole 20. The insulation layer 14 is formed of, e.g., a poly-para-xylylene film.

Voids are often formed in the resin 18, and concavities 42 due to the voids are often formed in the inside wall of the through-hole 20. The insulation layer 14 is formed, filling such concavities 42. Thus, when burrs 16 are exposed in the concavities 42, the burrs 16 are coated with the insulation layer 14.

Wirings 22a are formed on the insulation layer 14 formed on the upper surface of the conductive core material 10. Wirings 22b are formed on the insulation layer 14 formed on the undersurface of the conductive core material 10. A wiring 22d is formed in the through-hole 20 formed in the resin 18. The wiring 22d formed in the through-hole 20 interconnects the wirings 22a formed on the upper surface of the conductive core material 10 and the wirings 22b formed on the undersurface of the conductive core material 10 with each other. The wirings 22a, 22b, 22d are formed of, e.g., copper film. The wirings 22a, 22b and the conductive core material 10 are insulated from each other by the insulation layer 14. The wiring 22d and the conductive core material 10 are insulated from each other by the insulation layer 14 and the resin 18.

In FIG. 12, the wirings 22a, 22b of 1 layer alone are formed respectively on the upper surface and the undersurface of the conductive core material 10. On the upper surface and the undersurface of the conductive core material 10, the same wirings as described above are repeatedly formed with the insulation layer formed therebetween. Specifically multilayer wirings of, e.g., 5 layers (not illustrated) are formed. An overcoat layer (not illustrated) is formed on the uppermost layers of the upper surface and the undersurface of the conductive core material 10 with the multilayer wirings formed on.

Thus, the wiring board according to the present embodiment is constituted.

The wiring board according to the present embodiment is characterized mainly in that the insulation layer 14 is formed on the inside wall of the through-hole 20 formed in the resin 18.

Even when concavities 42 due to voids in the resin 18 are formed in the inside wall of the through-hole 20, and burrs 16 are exposed in the concavities 42, the burrs 16 are covered with the insulation layer 14. This can surely insulate the conductive core material 10 and the wiring 22d from each other. Thus, the wiring board of high reliability can be provided.

Next, the method for fabricating the wiring board according to the present embodiment will be explained with reference to FIGS. 13A-13C, 14A-14C and 15A-15B.

Figure 13A:
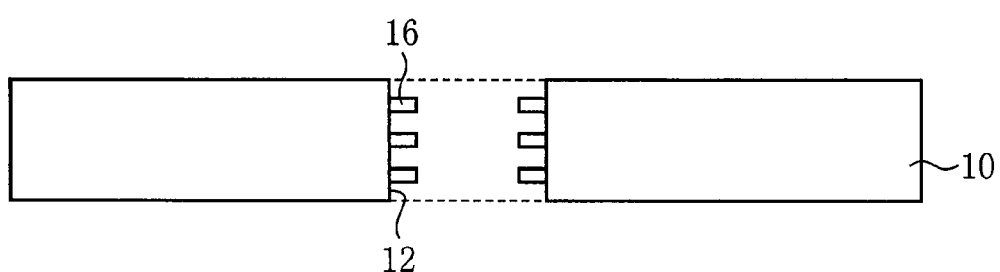
FIGS. 13A-13C, 14A-14C and 15A-15B are sectional views of the wiring board according to the fifth embodiment of the present invention in the steps of the method for fabricating the same, which illustrate the method.

First, in the same way as in the method for fabricating the wiring board according to the first embodiment, a through-hole 12 is formed in the plate-shaped conductive core material 10 (see FIG. 13A).

Next, prescribed degreasing processing and prescribed cleaning processing are performed on the conductive core material 10 with the through-hole 12 formed in.

Next, thermoplastic polyimide sheets are laminated by, e.g., vacuum press, on both surfaces of the conductive core material 10 with the through-hole 12 formed in. The temperature for the lamination by the vacuum press is, e.g., 200° C., and the press period of time is, e.g., 30 minutes. The thickness of the laminated thermoplastic polyimide sheets is, e.g., 0.05 mm. Thus, a resin 18 of polyimide is buried in the through-hole 12. After the resin 18 has been buried in the through-hole 12, the polyimide remaining on the upper surface and the undersurface of the conductive core material 10 is removed (see FIG. 13B). At this time, voids 36 are often formed in the resin 18.

Figure 13B:
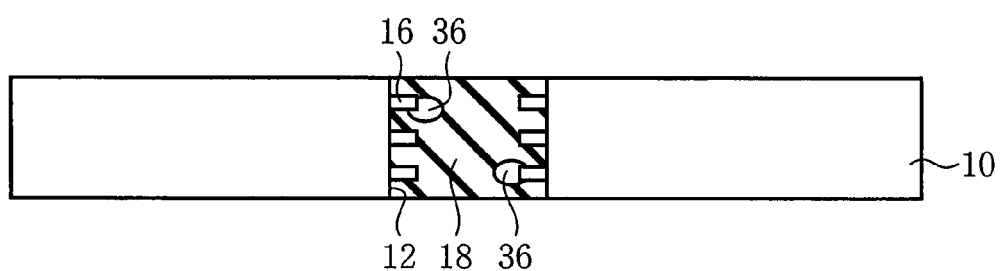
Figure 13C:
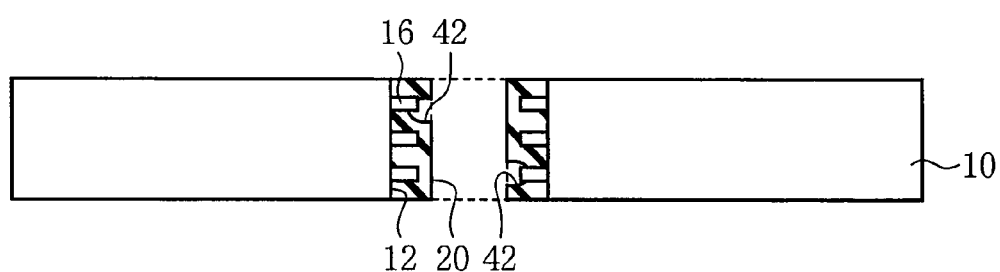

Then, a through-hole 20 is formed throughout the conductive core material 10 from the upper surface to the undersurface substantially at the center of the resin 18 buried in the through-hole 12 (see FIG. 13C). The diameter of the through-hole 20 is, e.g., 0.1 mm. The through-hole 20 is formed by dry etching such as laser dry etching using, e.g., UV-YAG laser, carbon dioxide gas laser, excimer laser or others, or plasma dry etching or others. The through-hole 20 may be formed by cutting using, e.g., a drill. At this time, concavities 42 due to the voids 36 in the resin 18 are often formed in the inside wall of the through-hole 20.

Figure 14A:
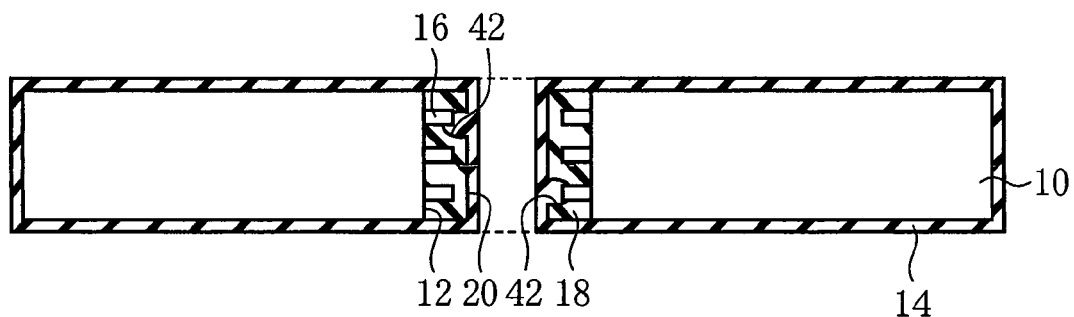
Figure 14B:
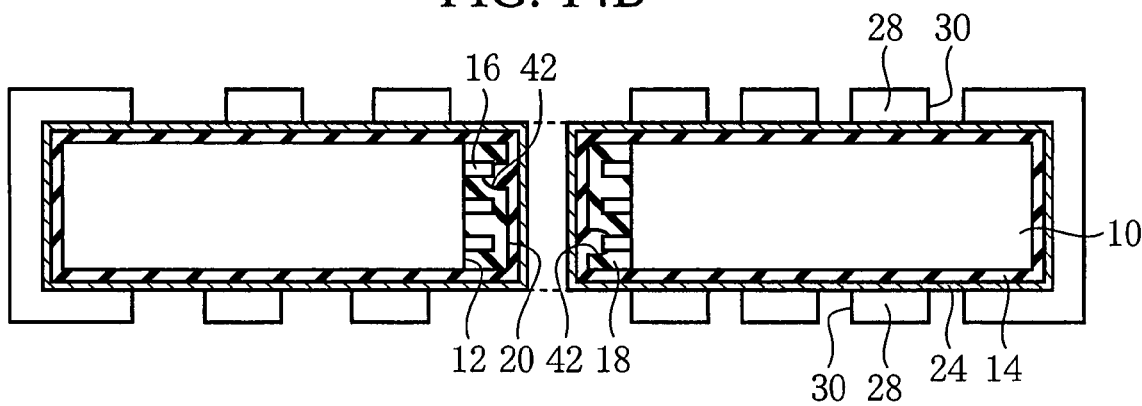

Next, desmearing processing is made on the through-hole 20, and then the insulation layer 14 of a poly-para-xylylene film of, e.g., a 20 μm-average film thickness is formed by vapor deposition on the entire surface, i.e., on the upper surface, the undersurface and the side surfaces of the conductive core material 10, on the resin 18 and on the inside wall of the through-hole 20 (see FIG. 14A).

The insulation layer 14 is formed, buried in the concavities 42 formed in the inside wall of the through-hole 20. Thus, the burrs 16 exposed in the concavities 42 are covered with the insulation layer 14.

As described above, according to the method for fabricating the wiring board according to the present embodiment, the insulation layer 14 is formed by vapor deposition using the raw material in the gas phase, which makes it possible to form the insulation layer 14 of high coverage with less fine pinholes formed in on the upper surface and the undersurface of the conductive core material 10 and also on the inside wall of the through-hole 20. This ensures the insulation between the conductive core material 10, and the wiring 22d, which is to be formed later in the through-hole 20 with the insulation layer 14 formed therebetween.

The poly-para-xylylene film forming the insulation layer 14 can be formed at the room temperature, which permits the insulation layer 14 to be formed without failure without the deterioration, breakage, etc. of the conduction core material 10 even when the conductive core material 10 is formed of a low heat-resistance material. Furthermore, without applying thermal stresses, the insulation layer 14 can be formed, which permits the insulation layer 14 to have small residual stresses. Accordingly, the generation of cracks due to stresses of the insulation layer 14 can be suppressed.

Then, a copper film 24 of, e.g., a 0.3 μm-thickness is formed by, e.g., electroless plating on the entire surface, i.e., on the insulation layer 14 formed on the upper surface, the undersurface and the side surfaces of the conductive core material 10, on the resin 18 and on the inside wall of the through-hole 20.

Next, the conductive core material 10 is laminated by a dry film resist to form a resist layer 28 of, e.g., a 50 μm-thickness on the copper film 24 formed on the upper surface and the undersurface of the conductive core material 10. Next, openings 30 for exposing the regions for the wirings to be formed in are formed in the resist layer 28 by photolithography (see FIG. 14B).

Figure 14C:
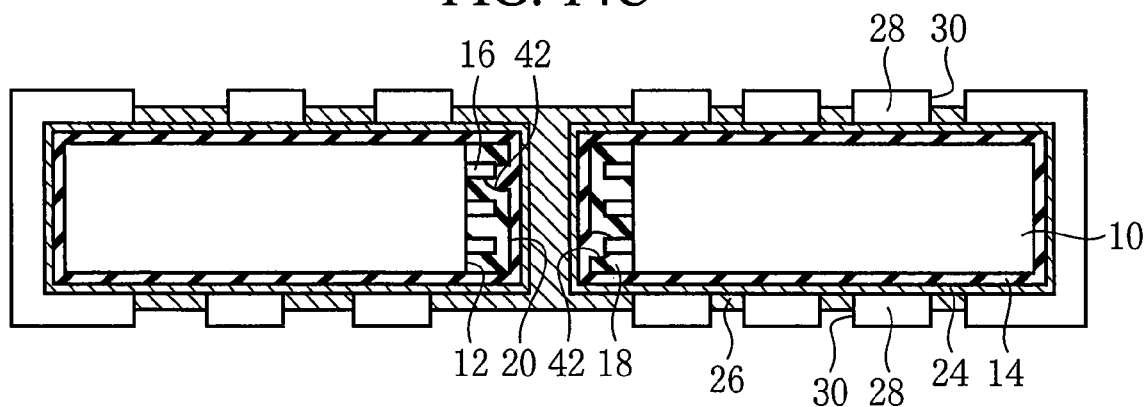

Then, by using as the seed the copper film 24 formed by the electroless plating, a copper film 26 of, e.g., a 20 μm-thickness is formed by electroplating on the copper film 24 exposed in the openings 30 in the resist layer 28 and on the copper film 24 formed on the inside wall of the through-hole 20 (see FIG. 14C).

Figure 15A:
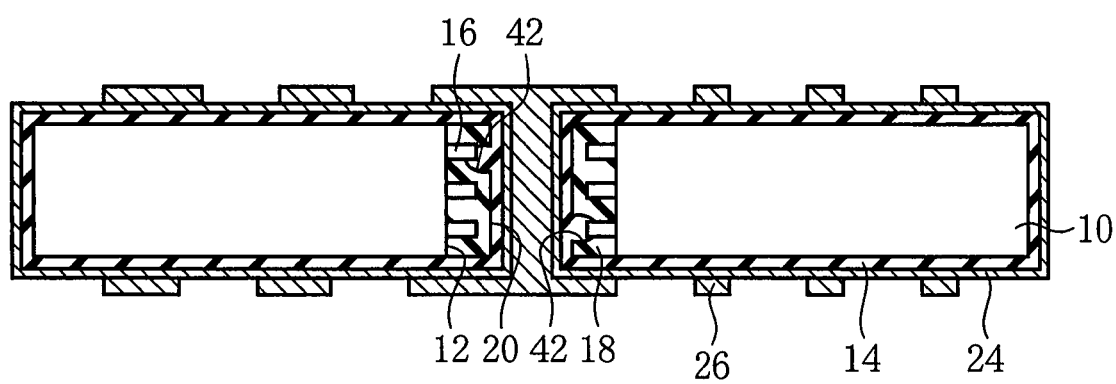
Figure 15B:
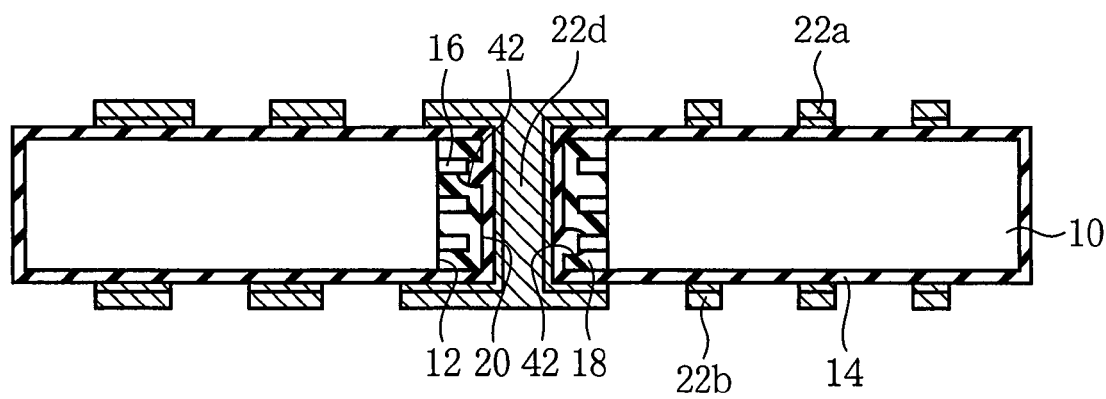

After the copper film 26 has been formed, the resist layer 28 is removed (see FIG. 15A).

Next, with the copper film 26 as the mask, the copper film 24 used as the seed is etched off. The etchant is a mixed liquid of, e.g., aqueous solution of hydrogen peroxide and sulfuric acid. Thus, the wirings 22a, 22b of the copper films 24, 26 are respectively formed on the insulation layer 14 formed on the upper surface and the undersurface of the conductive core material 10. Wirings (not illustrated) of the copper films 24, 26 are formed on the insulation layer 14 formed on the side surfaces of the conductive core material 10. The wiring 22d of the copper films 24, 26 is formed in the through-hole 20 with the insulation layer 14 formed in (see FIG. 15B).

Hereafter, the step of forming the insulation layer and the same steps of forming the wirings as described above are repeated to thereby form the multilayer wirings of, e.g., 5 layers (not illustrated) respectively on the upper surface and the undersurface of the conductive core material 10. The overcoat layer (not illustrated) is formed by, e.g., screen printing and photolithography on the uppermost layer on the upper surface and the undersurface of the conductive core material 10 with the multilayer wirings formed on.

Thus, the wiring board according to the present embodiment is fabricated.

As described above, according to the present embodiment, because of the insulation layer 14 formed on the inside wall of the through-hole 20 formed in the resin 18, even when concavities 42 due to voids in the resin 18 are formed in the inside wall of the through-hole 20, and burrs 16 are exposed in the concavities 42, the burrs 16 can be covered with the insulation layer 14. Thus, the conductive core material 10 and the wiring 22d can be surely insulated from each other. Accordingly, the wiring board of high reliability can be provided.

EXAMPLE 7

The conductive core material 10 was 5 sheets of the prepreg which was a composite of a 0.2 mm-carbon fiber sheet and a polyimide-group resin composition, which (the prepregs) were laminated by press in a 1.0 mm-thickness. The polyimide resin composition containing the carbon fiber sheet was mixed with an alumina filler by 10 weight % of the whole composition and a silica filler by 10 weight % of the whole composition. The alumina filler had an average particle diameter of below 7 μm including 7 μm and a 7 ppm/K thermal expansion coefficient. The silica filler had an average particle diameter of below 3 μm including 3 μm and a 3 ppm/K thermal expansion coefficient. The conductive core material 10 formed of these materials had, at 25-200° C., a 2 ppm/K average thermal expansion coefficient in the direction of expansion of the surface and a 80 ppm/K average thermal expansion coefficient in the thickness-wise direction. About 1000 through-holes 12 of a 0.5 mm-diameter were formed in the conductive core material 10. The insulation layer 14 was formed by vapor deposition as follows. First, the conductive core material 10 with the through-holes 12 formed in was placed on the film forming stage in the vapor deposition chamber of a vapor deposition system. In the thermal decomposition chamber of the vapor deposition system, 20 g of di-para-xylylene which is the dimer of the raw material was thermally decomposed under conditions of 510° C. and 25 mTorr to produce diradical para-xylylene. Subsequently, the produced diradical para-xylylene was fed into the vapor deposition chamber and vapor deposited under conditions of a 25° C. substrate temperature and a 30 mTorr vapor deposition chamber internal pressure. The vapor deposition period of time was 6 hours. Thus, the insulation layer 14 of the poly-para-xylylene film of a 20 μm-average film thickness was formed by vapor deposition.

(Control 7)

As a control, a wiring board with the resin 18 buried directly in the through-holes 12 without forming the insulation layer 14 was prepared. Control 7 was the same as Example 7 except that the in the former the insulation layer 14 was not formed.

(Evaluation Result)

A temperature cycle test in which 1 cycle of 15 minute-cooling at −65° C. and 15 minute-heating at 125° C. was repeated 1000 times was made on Example 7 and Control 7 described above.

Based on the results of the temperature cycle test, in Example 7, the resistance change percentage at the electrical connections was below +5% including +5%. No crack and peel were observed in the insulation layer 14, the wirings 22d, etc. formed in the through-holes 12. No short circuit due to the intrusion of the plating solution for copper in forming the wirings 22d was observed.

On the other hand, in Control 7, based on the result of the temperature cycle test, short circuit was observed in the wirings 22d at the centers of the through-holes 20.

A Sixth Embodiment

Figure 16A:
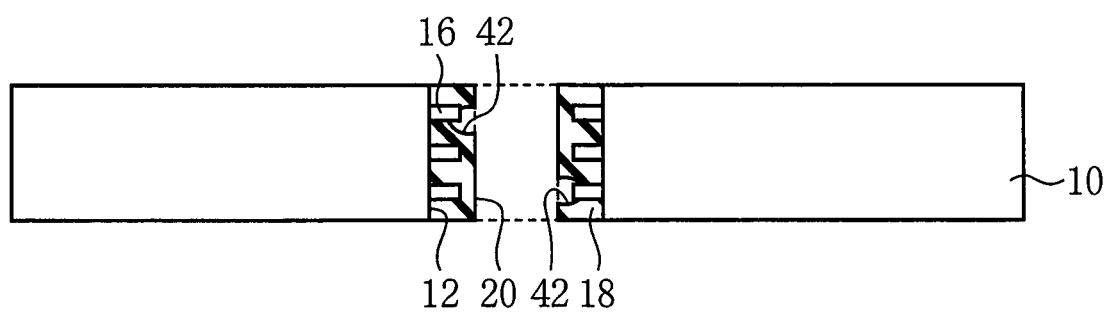
FIGS. 16A-16B are sectional views of the wiring board according to a sixth embodiment of the present invention in the steps of the method for fabricating the same, which illustrate the method.
Figure 16B:
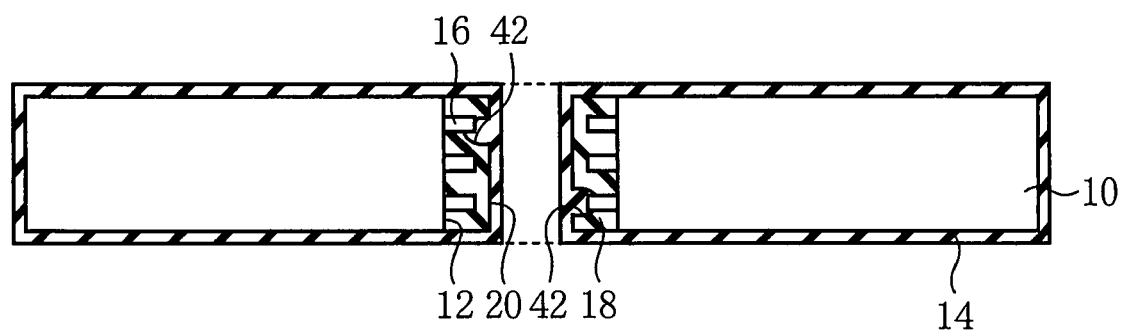

The wiring board and the method for fabricating the same according to a sixth embodiment of the present invention will be explained with reference to FIGS. 16A-16B. FIGS. 16A-16B are sectional views of the wiring board according to the present embodiment in the steps of the method for fabricating the same, which illustrate the method. The same members of the present embodiment as those of the wiring board and the method for fabricating the same according to the first to the fifth embodiments are represented by the same reference numbers not to repeat or to simplify their explanation.

The structure of the wiring board according to the present embodiment is substantially the same as the wring substrate according to the fifth embodiment. The wiring board according to the present embodiment is different from the wiring board according to the fifth embodiment in that in the former, an insulation layer 14 is formed by electrodeposition. The method for fabricating the wiring board according to the present embodiment will be explained with reference to FIGS. 16A-16B.

First, in the same way as in the method for fabricating the wiring board according to the fifth embodiments illustrated in FIGS. 13A to 13C, a through-hole 12 is formed in a plate-shaped conductive core material 10, then a resin 18 is buried in the through-hole 12, and then a through-hole 20 is formed in the resin 18 (see FIG. 16A).

Next, the insulation layer 14 of a polyimide film of, e.g., a 15 μm average film thickness is formed on the entire surface, i.e., the upper surface, the undersurface and the side surfaces of the conductive core material 10, on the resin 18 and on the inside wall of the through-hole 20 by electrodeposition using the carbon fibers in the conductive core material 10 as the electrode (see FIG.16B).

The insulation layer 14 is formed, buried in concavities 42 formed in the inside wall of the through-hole 20. Burrs 16 exposed in the concavities 42 are covered with the insulation layer 14.

Here, the polyimide forming the insulation layer 14 has already had the heat-resistant imidized molecular structure before electrodeposited on the conductive core material 10. Accordingly, in forming the insulation layer 14 of the polyimide film, no thermal processing step for imidization at about 400° C. is necessary. Thus, even when the heat resistance of the conductive core material 10 is low, the insulation layer 14 can be surely formed without the deterioration, breakage, etc. of the conductive core material 10.

The steps following the formation of the insulation layer 14 are the same as those of the method for fabricating the wiring board according to the fifth embodiment illustrated in FIGS. 14B to 15B, and their explanation will not be repeated.

As described above, according to the present embodiment, because of the insulation layer 14 formed on the inside wall of the through-hole 20 formed in the resin 18, even when concavities 42 due to voids in the resin 18 are formed in the inside wall of the through-hole 20, and burrs 16 are exposed in the concavities 42, the burrs 16 can be covered with the insulation layer 14. Thus, the conductive core material 10 and the wiring 22d can be surely insulated from each other. Accordingly, the wiring board of high reliability can be provided.

EXAMPLE 8

The conductive core material 10 was 5 sheets of the prepreg which was a composite of a 0.2 mm-carbon fiber sheet and a polyimide-group resin composition, which (the prepregs) were laminated by press in a 1.0 mm-thickness. The polyimide resin composition containing the carbon fiber sheet was mixed with an alumina filler by 10 weight % of the whole composition and a silica filler by 10 weight % of the whole composition. The alumina filler had an average particle diameter of below 7 μm including 7 μm and a 7 ppm/K thermal expansion coefficient. The silica filler had an average particle diameter of below 3 μm including 3 μm and a 3 ppm/K thermal expansion coefficient. The conductive core material 10 formed of these materials had, at 25-200° C., a 2 ppm/K average thermal expansion coefficient in the direction of expansion of the surface and a 80 ppm/K average thermal expansion coefficient in the thickness-wise direction. About 1000 through-holes 12 of a 0.5 mm-diameter were formed in the conductive core material 10. The insulation layer 14 was formed by electrodeposition as follows. First, the conductive core material 10 was immersed in a polyimide electrodeposition liquid filled in a stainless vessel. A part of the side surfaces of the conductive core material 10, where the carbon fibers are exposed was connected to a direct current source. The conductive core material 10 immersed in the polyimide electrodeposition liquid was charged from the direct current source by constant-current method for 180 seconds under conditions of 50 mA and 5 coulomb and was coated with the polyimide. Then, the conductive core material 10 coated with the polyimide was dried in steps at 90° C. for 30 minutes and sequentially at 180° C. for 30 minutes. Thus, the insulation layer 14 of the polyimide film of a 15 μm-average film thickness was formed by the electrodeposition.

(Control 8)

As a control, a wiring board with the resin 18 buried directly in the through-holes 12 without forming the insulation layer 14 was prepared. Control 8 was the same as Example 8 except that in the former the insulation layer 14 was not formed.

(Evaluation Result)

A temperature cycle test in which 1 cycle of 15 minute-cooling at −65° C. and 15 minute-heating at 125° C. was repeated 1000 times was made on Example 8 and Control 8 described above.

Based on the results of the temperature cycle test, in Example 8, the resistance change percentage at the electrical connections was below +5% including +5%. No crack and peel were observed in the insulation layer 14, the wirings 22d, etc. formed in the through-holes 12. No short circuit due to the intrusion of the plating solution for copper in forming the wirings 22d was observed.

On the other hand, in Control 8, based on the result of the temperature cycle test, short circuit was observed in the wirings 22d at the centers of the through-holes 20.

A Seventh Embodiment

Figure 17A:
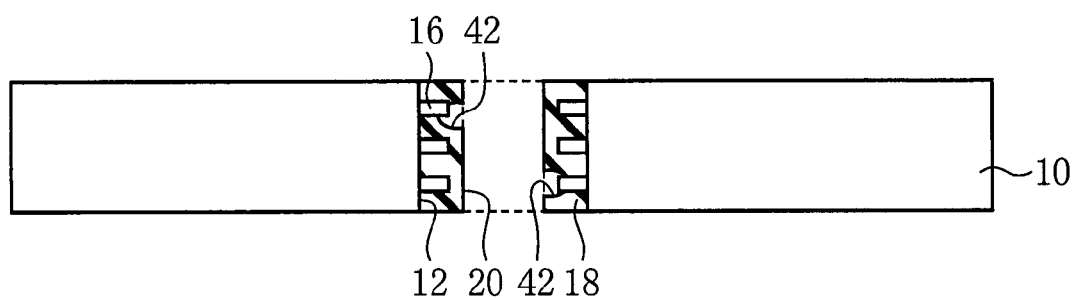
FIG. 17 is a sectional view of the wiring board according to a seventh embodiment of the present invention, which illustrates a structure thereof.
Figure 17B:
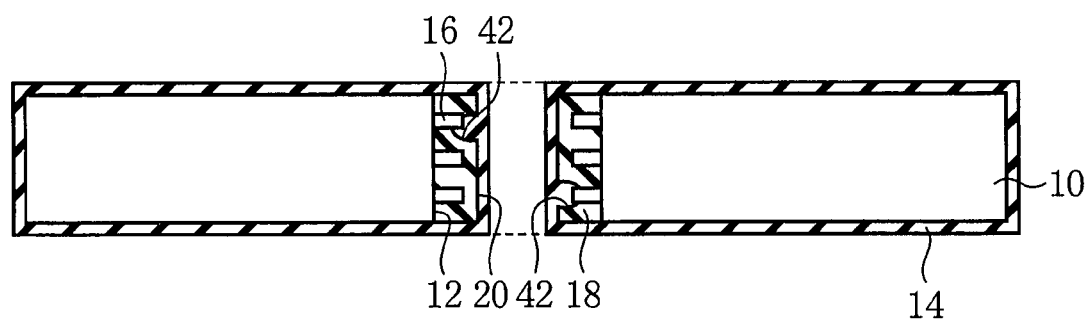

The wiring board and the method for fabricating the same according to a seventh embodiment of the present invention will be explained with reference to FIGS. 17, 18A-18C, 19A-19C and 20A-20C. FIG. 17 is a sectional view of the wiring board according to the present embodiment, which illustrates a structure thereof. FIGS. 18A-18C, 19A-19C and 20A-20C are sectional views of the wiring board according to the present embodiment in the steps of the method for fabricating the same, which illustrate the method. The same members of the present embodiments as those of the wiring board according to the first to the sixth embodiments are represented by the same reference numbers not to repeat or to simplify their explanation.

The wiring board according to the present embodiment is characterized mainly in that the wiring board according to the fifth embodiment further comprises a metal layer formed by plating between an insulation layer 14 and a conductive core material 10. The wiring board according to the present embodiment will be explained with reference to FIG. 17.

A through-hole 12 is formed throughout a plane-shaped conductive core material 10 from the upper surface thereof to the undersurface thereof. A prescribed number of the through-holes 12 corresponding to an wiring layout or others are formed in the conductive core material 10. Specifically, about 1000 through-holes 12, for example, are formed. The diameter of the through-holes 12 is, e.g., 0.5 mm.

The conductive core material 10 is a resin substrate containing carbon fibers and comprises 5 sheets, for example, of the prepreg (not illustrated) which is a composite of, e.g., a 0.2 mm-carbon fiber sheet and a polyimide-group resin composition, which (the prepregs) are laminated by press. The thickness of the conductive core material 10 is, e.g., 1.0 mm. The carbon sheet is formed of carbon fibers knitted in a sheet. The polyimide-group resin composition containing the carbon fiber sheet is mixed with an inorganic filler, such as alumina filler, aluminum nitride filler, silica filler or others, for decreasing the thermal expansion coefficient.

A resin 18 is buried in the through-hole 12. The resin 18 is, e.g., polyimide. Burrs 16 present on the inside wall of the through-hole 12 are coated with the resin 18.

A through-hole 20 is formed throughout the conductive core material 10 from the upper surface to the undersurface substantially at the center of the resin 18 buried in the through-hole 12. The diameter of the through-hole 20 is, e.g., 0.2 mm.

A metal layer 40 of a copper film of, e.g. a 20 μm-thickness is formed on the upper surface, the undersurface and the side surfaces of the conductive core material 10, on the resin 18 and on the inside wall of the through-hole 20.

Voids are often formed in the resin 18, and concavities 42 due to the voids are often formed in the inside wall of the through-hole 20. The metal layer 40 is formed, filling such concavities 42. Thus, when burrs 16 are exposed in the concavities 42, the burrs 16 are covered with the metal layer 40.

The insulation layer 14 of a resin of, e.g., a 20 μm-average film thickness is formed on the metal layer 40 formed on the upper surface, the undersurface and the side surfaces of the conductive core material 10 and formed on the inside wall of the through-hole 20. The insulation layer 14 is formed of, e.g., a poly-para-xylylene film.

Wirings 22a are formed on the insulation layer 14 formed on the upper surface of the conductive core material 10. Wirings 22b are formed on the insulation layer 14 formed on the undersurface of the conductive core material 10. Wirings (not illustrated) are formed on the insulation layer 14 formed on the side surfaces of the conductive core material 10. A wiring 22d is formed in the through-hole 20 formed in the resin 18. The wiring 22d formed in the through-hole 20 electrically interconnects the wirings 22a formed on the upper surface of the conductive core material 10 and the wirings 22b formed on the undersurface of the conductive core material 10 with each other. The wirings 22a, 22b, 22d are formed of, e.g., copper film. The wirings 22a, 22b and the conductive core material 10 are insulated from each other by the insulation layer 14. The wiring 22d and the conductive core material 10 are insulated from each other by the insulation layer 14 and the resin 18.

In FIG. 17, the wirings 22a, 22b of 1 layer alone are formed respectively on the upper surface and the undersurface of the conductive core material 10. On the upper surface and the undersurface of the conductive core material 10, the same wirings as described above are repeatedly formed with the insulation layer formed therebetween. Specifically, multi-layer wirings of, e.g., 5 layers (not illustrated) are formed. An overcoat layer (not illustrated) is formed on the uppermost layers of the upper surface and the undersurface of the conductive core material 10 with the multilayer wirings formed on.

Thus, the wiring board according to the present embodiment is constituted.

In the wiring board according to the present embodiment, as described above, because the metal layer 40 is formed on the inside wall of the through-hole 20 formed in the resin 18, the roughness of the surface of the inside wall of the through-hole 20 is reduced. The insulation layer 14, which is formed on the inside wall of the through-hole 20 having the surface roughness reduced by the metal layer 40, is formed with higher adhesion in comparison with the insulation layers 14 of the wiring board according to the fifth and the sixth embodiments. Such insulation layer 14 can further surely insulate the conductive core material 10 and the wirings 22d from each other. Thus, wiring board of higher reliability can be provided.

Furthermore, even when concavities 42 due to voids in the resin 18 are formed in the inside wall of the through-hole 20, and burrs 16 are exposed in the concavities 42, the burrs 16 are coated with the metal layer 40. Because the insulation layer 14 is formed on the metal layer 40, the conductive core material 10 and the wiring 22d can be surely insulated from each other.

Next, the method for fabricating the wiring board according to the present embodiment will be explained with reference to FIGS. 18A-18C, 19A-19C and 20A-20C.

Figure 18A:
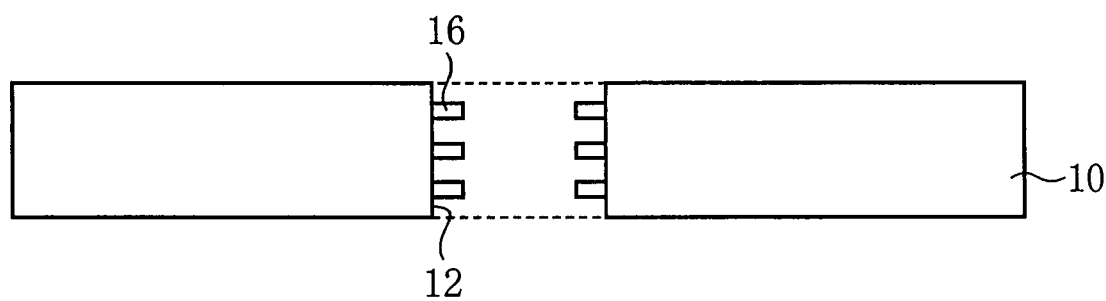
FIGS. 18A-18C, 19A-19C and 20A-20C are sectional views of the wiring board according to the seventh embodiment of the present invention in the steps of the method for fabricating the same, which illustrate the method.
Figure 18B:
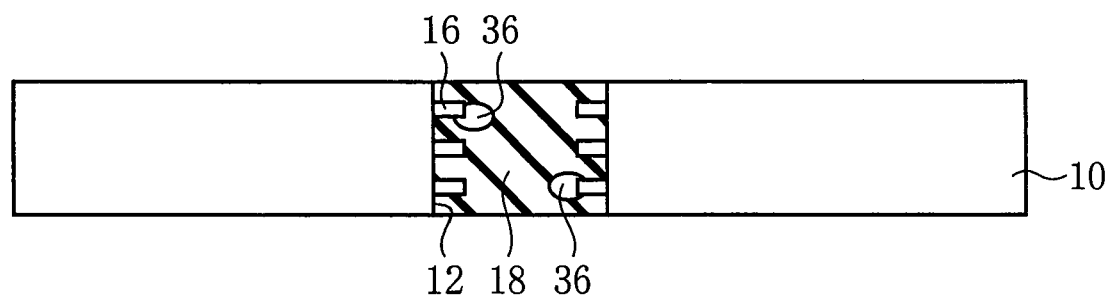

First, in the same way as in the method for fabricating the wiring board according to the first embodiment, a through-hole 12 is formed in a plate-shaped conductive core material 10 (see FIG. 18A).

Next, prescribed degreasing processing and prescribed cleaning processing are made on the conductive core material 10 with the through-hole 12 formed in.

Next, thermoplastic polyimide sheets are laminated by, e.g., vacuum press, on both surfaces of the conductive core material 10 with the through-hole 12 formed in. The temperature for the lamination by the vacuum press is, e.g., 200° C., and the press period of time is, e.g., 30 minutes. The thickness of the laminated thermoplastic polyimide sheets is, e.g., 0.05 mm. Thus, a resin 18 of polyimide is buried in the through-hole 12. After the resin 18 has been buried in the through-hole 12, the polyimide remaining on the upper surface and the undersurface of the conductive core material 10 is removed (see FIG. 18B). At this time, voids 36 are often formed in the resin 18.

Figure 18C:
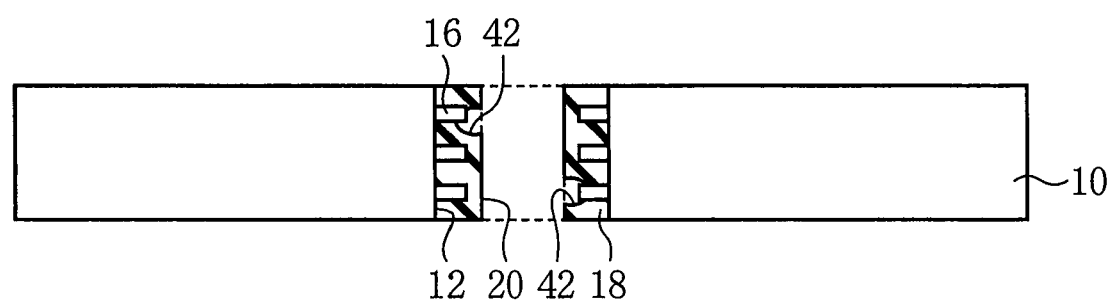

Next, a through-hole 20 is formed throughout the conductive core material 10 from the upper surface to the undersurface substantially at the center of the resin 18 buried in the through-hole 12 (see FIG. 18C). The diameter of the through-hole 12 is, e.g., 200 μm. The through-hole 20 is formed by dry etching such as laser dry etching using, e.g., UV-YAG laser, carbon dioxide gas laser, excimer laser or others, or plasma dry etching or others. The through-hole 20 may be formed by cutting using, e.g., a drill. At this time, concavities 42 due to the voids 36 in the resin 18 are often formed in the inside wall of the through-hole 20.

Next, desmearing processing is made on the through-hole 20, and then the copper film of a 0.3 μm-thickness is formed by electroless plating on the entire surface, i.e., on the upper surface, the undersurface and the side surfaces of the conductive core material 10 and on the inside wall of the through-hole 20.

Then, the copper film of, e.g., a 20 μm-thickness is further formed on the upper surface, the undersurface and the side surfaces of the conductive core material 10 and on the inside wall of the through-hole 20 by electroplating using as the seed the copper film formed by the electroless plating. Thus, the metal layer 40 of, e.g., a 20 μm-thickness is formed on the upper surface, the undersurface and the side surfaces of the conductive core material 10 and on the inside wall of the through-hole 20 (see FIG. 19A).

The metal layer 40 is formed, filling concavities 42 formed in the inside wall of the through-hole 20. Thus, burrs 16 exposed in the concavities 42 are covered with the metal layer 40.

Figure 19A:
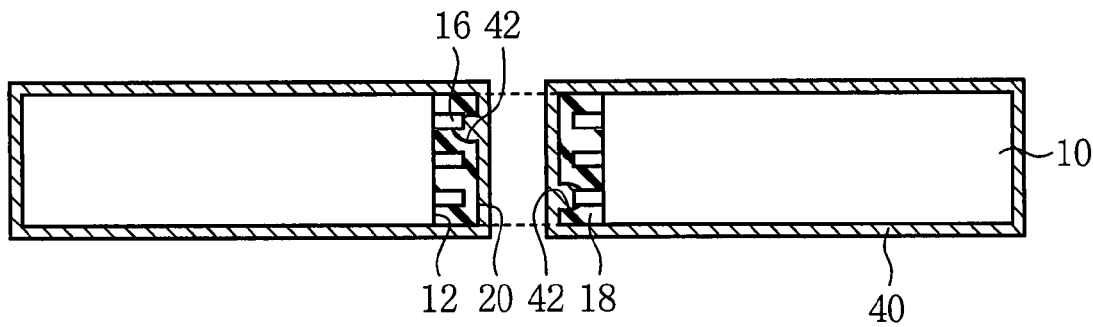
Figure 19B:
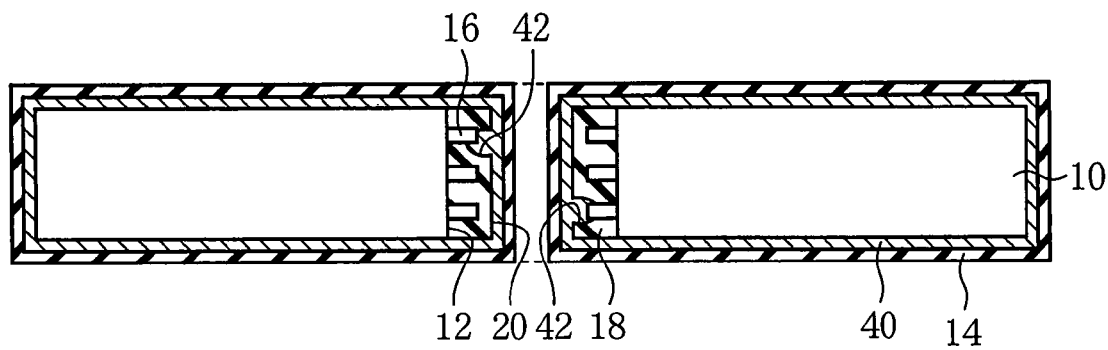
Figure 19C:
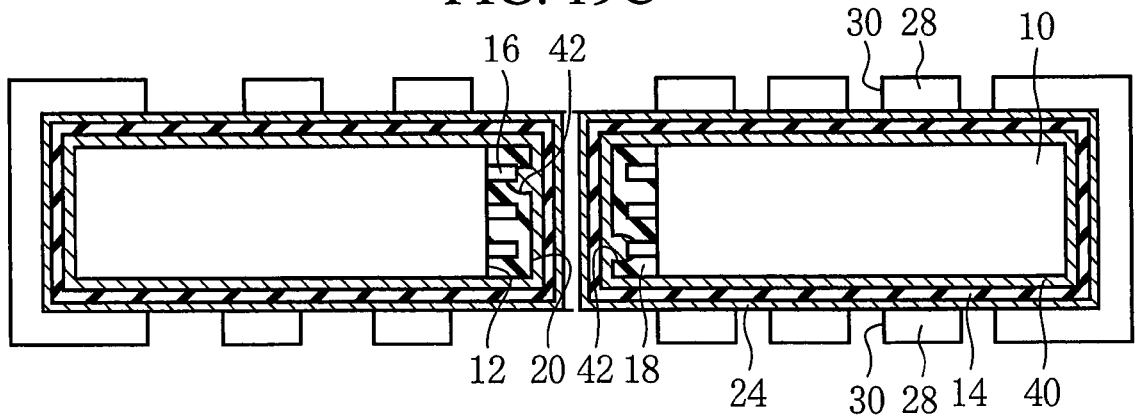

Next, the insulation layer 40 of a poly-para-xylylene film of, e.g., a 20 μm-average film thickness is formed by vapor deposition on the entire surface, i.e., on the metal layer 40 formed on the upper surface, the undersurface and the side surfaces of the conductive core material 10 and on the metal layer 40 formed on the inside wall of the through-hole 20 (see FIG. 19B).

As described above, according to the method for fabricating the wiring board according to the present embodiment, the insulation layer 14 is formed by vapor deposition using the raw material in the gas phase, which makes it possible to form the insulation layer 14 of high coverage with less fine pinholes formed in on the upper surface and the undersurface of the conductive core material 10 and also on the inside wall of the through-hole 20. This ensures the insulation between the conductive core material 10, and the wiring 22d, which is to be formed later in the through-hole 20 with the insulation layer 14 formed therebetween.

The poly-para-xylylene film forming the insulation layer 14 can be formed at the room temperature, which permits the insulation layer 14 to be formed without failure without the deterioration, breakage, etc. of the conduction core material 10 even when the conductive core material 10 is formed of a low heat-resistance material. Furthermore, without applying thermal stresses, the insulation layer 14 can be formed, which permits the insulation layer 14 to have small residual stresses. Accordingly, the generation of cracks due to stresses of the insulation layer 14 can be suppressed.

Then, a copper film 24 of, e.g., a 0.3 μm-thickness is formed by, e.g., electroless plating on the entire surface, i.e., on the insulation layer 14 formed on the upper surface, the undersurface and side surfaces of the conductive core material 10, on the resin 18 and on the inside wall of the through-hole 20.

Then, the conductive core material 10 is laminated by a dry film resist to form a resist layer 28 of, e.g., a 50 μm-thickness on the copper film 24 formed on the upper surface and the undersurface of the conductive core material 10. Next, openings 30 for exposing the regions for the wirings to be formed in are formed in the resist layer 28 by photolithography (see FIG. 20A).

Figure 20A:
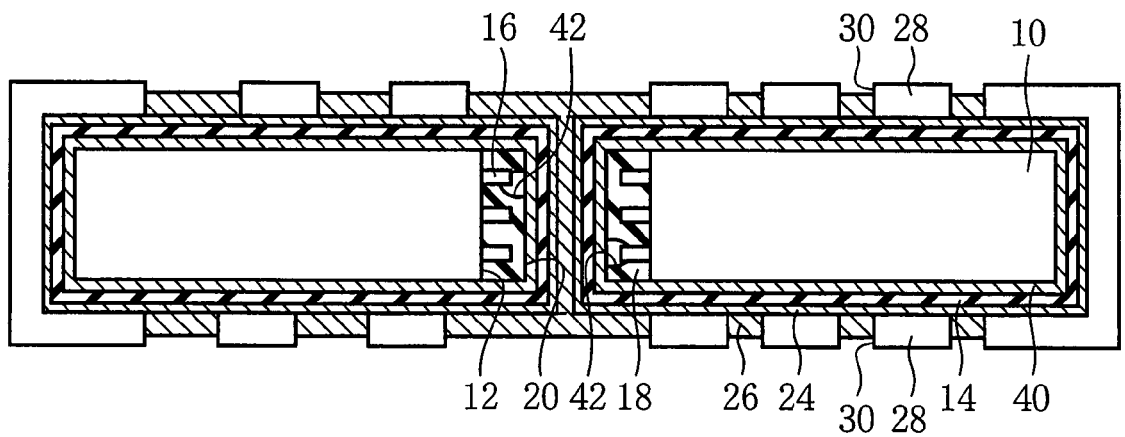
Figure 20B:
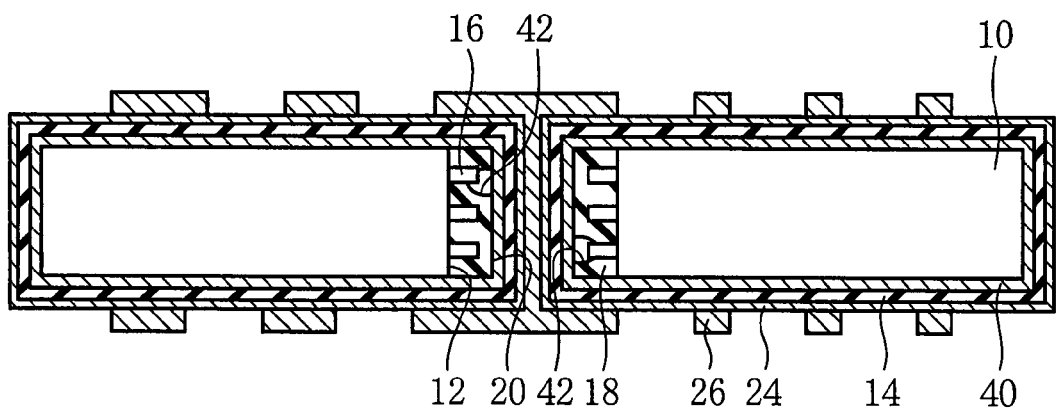
Figure 20C:
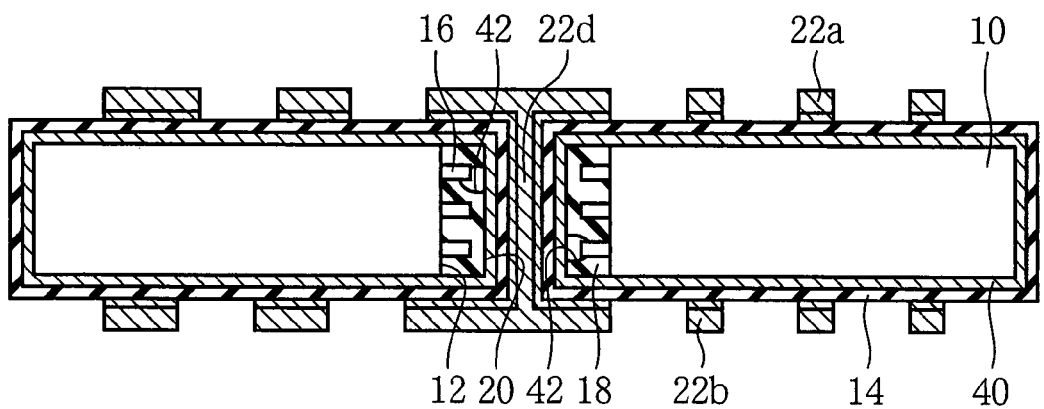

Then, by using as the seed the copper film 24 formed by the electroless plating, a copper film 26 of, e.g., a 20 μm-thickness is formed by electroplating on the copper film 24 exposed in the openings 30 in the resist layer 28 and on the copper film 24 formed on the inside wall of the through-hole 20 (see FIG. 20B).

After the copper film 26 has been formed, the resist layer 28 is removed (see FIG. 20B).

Next, with the copper film 26 as the mask, the copper film 24 used as the seed is etched off. The etchant is a mixed liquid of, e.g., aqueous solution of hydrogen peroxide and sulfuric acid. Thus, the wirings 22a, 22b of the copper films 24, 26 are formed respectively on the insulation layer 14 formed on the upper surface and the undersurface of the conductive core material 10. Wirings (not illustrated) are formed on the insulation layer 14 formed on the side surfaces of the conductive core material 10. The wiring 22d of the copper films 24, 26 is formed in the through-hole 20 with the insulation layer 14 formed in (see FIG. 20C).

Hereafter, the step of forming the insulation layer and the same steps of forming the wirings as described above are repeated to thereby form the multilayer wirings of, e.g., 5 layers (not illustrated) respectively on the upper surface and the undersurface of the conductive core material 10. The overcoat layer (not illustrated) is formed by, e.g., screen printing and photolithography on the uppermost layer on the upper surface and the undersurface of the conductive core material 10 with the multilayer wirings formed on.

Thus, the wiring board according to the present embodiment is fabricated.

As described above, according to the present embodiment, the insulation layer 14 is formed on the inside wall of the through-hole 20 in the resin 18 with the metal layer 40 therebetween, which permits the insulation layer 14 to be formed with higher adhesion. This more surely insulates the conductive core material 10 and the wiring 22d from each other. Accordingly, the wiring board of higher reliability can be provided.

Furthermore, according to the present embodiments, even when concavities 42 due to voids in the resin 18 are formed in the inside wall of the through-hole 20, and burrs 16 are exposed in the concavities 42, the burrs 16 can be covered with the metal layer 40. Because of the insulation layer 14 formed on such metal layer 40, the conductive cover material 10 and the wiring 22d can be surely insulated from each other.

EXAMPLE 9

The conductive core material 10 was 5 sheets of the prepreg which was a composite of a 0.2 mm-carbon fiber sheet and a polyimide-group resin composition, which (the prepregs) were laminated by press in a 1.0 mm-thickness. The polyimide resin composition containing the carbon fiber sheet was mixed with an alumina filler by 10 weight % of the whole composition and a silica filler by 10 weight % of the whole composition. The alumina filler had an average particle diameter of below 7 µm including 7 µm and a 7 ppm/K thermal expansion coefficient. The silica filler had an average particle diameter of below 3 µm including 3 µm and a 3 ppm/K thermal expansion coefficient. The conductive core material 10 formed of these materials had, at 25-200° C., a 2 ppm/K average thermal expansion coefficient in the direction of expansion of the surface and a 80 ppm/K average thermal expansion coefficient in the thickness-wise direction. About 1000 through-holes 12 of a 0.5 mm-diameter were formed in the conductive core material 10. The insulation layer 14 was formed by vapor deposition as follows. First, the conductive core material 10 with the through-holes 12 formed in was placed on the film forming stage in the vapor deposition chamber of a vapor deposition system. In the thermal decomposition chamber of the vapor deposition system, 20 g of di-para-xylylene which is the dimer of the raw material was thermally decomposed under conditions of 510° C. and 25 mTorr to produce diradical para-xylylene. Subsequently, the produced diradical para-xylylene was fed into the vapor deposition chamber and vapor deposited under conditions of a 25° C. substrate temperature and a 30 mTorr vapor deposition chamber internal pressure. The vapor deposition period of time was 6 hours. Thus, the insulation layer 14 of the poly-para-xylylene film of a 20 µm-average film thickness was formed by vapor deposition.

(Control 9)

As a control, a wiring board with a resin 18 buried directly in the through-holes 12 without forming the insulation layer 14 was prepared. Control 9 was the same as Example 9 except that the in the former the insulation layer 14 was not formed.

(Evaluation Result)

A temperature cycle test in which 1 cycle of 15 minute-cooling at −65° C. and 15 minute-heating at 125° C. was repeated 1000 times was made on Example 9 and Control 9 described above.

Based on the results of the temperature cycle test, in Example 9, the resistance change percentage at the electrical connections was below +5% including +5%. No crack and peel were observed in the insulation layer 14, the wirings 22*d*, etc. formed in the through-holes 12. No short circuit due to the intrusion of the plating solution for copper in forming the wirings 22*d* was observed.

On the other hand, in Control 9, based on the result of the temperature cycle test, short circuit was observed in the wirings 22*d* at the centers of the through-holes 20.

An Eighth Embodiment

Figure 21A:
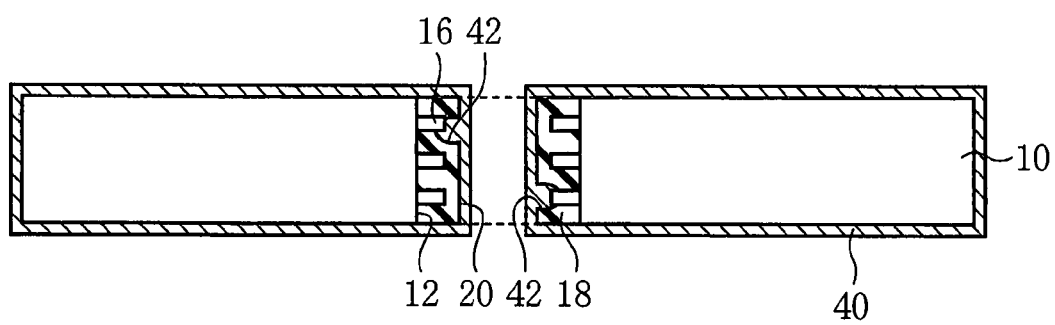
FIGS. 21A-21B are sectional views of the wiring board according to an eighth embodiment of the present invention in the steps of the method for fabricating the same, which illustrate the method.
Figure 21B:
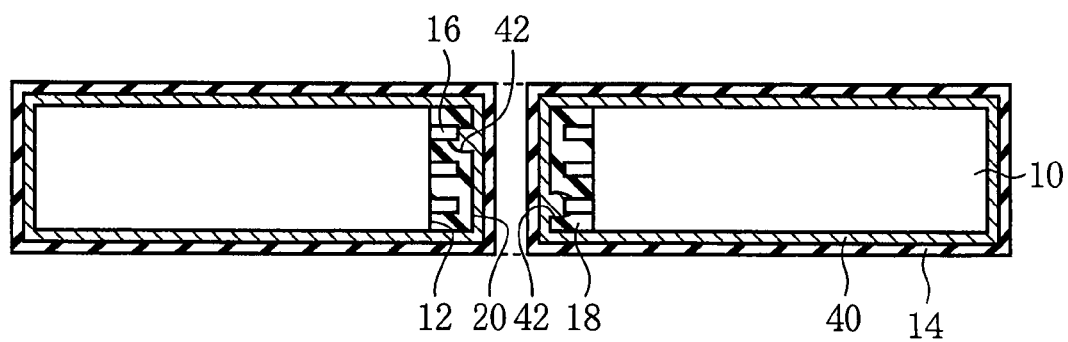

The wiring board and the method for fabricating the same according to an eighth embodiment of the present invention will be explained with reference to FIGS. 21A-21B. FIGS. 21A-21B are sectional views of the wiring board according to the present embodiment in the steps of the method for fabricating the wiring board, which illustrate the method. The same members of the present embodiment as those of the wiring board and the method for fabrication the same according to the first to the seventh embodiments are represented by the same reference numbers not to repeat or to simplify their explanation.

The structure of the wiring board according to the present embodiment is substantially the same as the wiring board according to the seventh embodiment. The wiring board according to the present embodiment is different from the wiring board according to the seventh embodiment in that in the former an insulation layer 14 is formed by electrodeposition. The method for fabricating the wiring board according to the present embodiment will be explained with reference to FIGS. 21A-21B.

First, in the same way as in the method for fabricating the wiring board according to the seventh embodiment illustrated in FIGS. 18A to 19A, a through-hole 12 is formed in a plate-shaped conductive core material 10, then a resin 18 is buried in the through-hole 12, and a through-hole 20 is formed in the resin 18. Then, a metal layer 40 is formed on the upper surface, the undersurface and the side surfaces of the conductive core material 10 (see FIG. 21A).

Then, the insulation layer 14 of a polyimide film of, e.g., a 20 µm-average film thickness is formed on the metal layer 40 formed on the entire surface, i.e., the upper surface, the undersurface and the side surfaces of the conductive core material 10, and on the metal layer 40 formed on the inside wall of the through-hole 20 by electrodeposition using the metal layer 40 as the electrode (see FIG. 21B).

Here, the polyimide forming the insulation layer 14 has already had the heat-resistant imidized molecular structure before electrodeposited on the conductive core material 10. Accordingly, in forming the insulation layer 14 of the polyimide film, no thermal processing step for imidization at about 400° C. is necessary. Thus, even when the heat resistance of the conductive core material 10 is low, the insulation layer 14 can be surely formed without the deterioration, breakage, etc. of the conductive core material 10.

The steps after the insulation layer 14 has been formed are the same as those of the method for fabricating the wiring board according to the seventh embodiment illustrated in FIGS. 19C to 20C, and their explanation will not be repeated.

As described above, according to the present embodiment, on the inside wall of the through-hole 20 formed in the resin 18, the insulation layer 14 is formed with the metal layer 40 formed therebetween, which permits the insulation layer 14 to be formed with higher adhesion. This surely insulates the conductive core material 10 and the wiring 22*d* from each other. Accordingly, the wiring board of higher reliability can be provided.

Furthermore, even when concavities 42 due to voids in the resin 18 are formed in the inside wall of the through-hole 20, and burrs 16 are exposed in the concavities 42, the burrs 16 are coated with the metal layer 40. Because the insulation layer 14 is formed on the metal layer 40, the conductive core material 10 and the wirings 22*d* can be surely insulated from each other.

EXAMPLE 10

The conductive core material 10 was 5 sheets of the prepreg which was a composite of a 0.2 mm-carbon fiber sheet and a polyimide-group resin composition, which (the prepregs) were laminated by press in a 1.0 mm-thickness. The polyimide resin composition containing the carbon fiber sheet was mixed with an alumina filler by 10 weight % of the whole composition and a silica filler by 10 weight % of the whole composition. The alumina filler had an average particle diameter of below 7 µm including 7 µm and a 7 ppm/K thermal expansion coefficient. The silica filler had an average particle diameter of below 3 µm including 3 µm and a 3 ppm/K thermal expansion coefficient. The conductive core material 10 formed of these materials had, at 25-200° C., a 2 ppm/K average thermal expansion coefficient in the direction of expansion of the surface and a 80 ppm/K average thermal expansion coefficient in the thickness-wise direction. About 1000 through-holes 12 of a 0.5 mm-diameter were formed in the conductive core material 10. The insulation layer 14 was formed by electrodeposition as follows. First, the conductive core material 10 was immersed in a polyimide electrodeposition liquid filled in a stainless vessel. A part of the side surfaces of the conductive core material 10, where the carbon fibers are exposed is connected to a direct current source. The conductive core material 10 immersed in the polyimide electrodeposition liquid was charged from the direct current source by constant-current method for 120 seconds under conditions of 100 V and 10 coulomb and was coated with the polyimide. Then, the conductive core material 10 coated with the polyimide was dried in steps at 90° C. for 30 minutes and sequentially at 180° C. for 30 minutes. Thus, the insulation layer 14 of the polyimide film of a 20 µm-average film thickness was formed by the electrodeposition.

(Control 10)

As a control, a wiring board with a resin 18 buried directly in the through-holes 12 without forming the insulation layer 14 was prepared. Control 10 was the same as Example 10 except that in the former the insulation layer 14 was not formed.

(Evaluation Result)

A temperature cycle test in which 1 cycle of 15 minute-cooling at −65° C. and 15 minute-heating at 125° C. was repeated 1000 times was made on Example 10 and Control 10 described above.

Based on the results of the temperature cycle test, in Example 10, the resistance change percentage at the electrical connections was below +5% including +5%. No crack and peel were observed in the insulation layer 14, the wirings 22d, etc. formed in the through-holes 12. No short circuit due to the intrusion of the plating solution for copper in forming the wirings 22d was observed.

On the other hand, in Control 10, based on the result of the temperature cycle test, short circuit was observed in the wirings 22d at the centers of the through-holes 20.

Modified Embodiments

The present invention is not limited to the above-described embodiments and can cover other various modifications.

For example, in the above-described embodiments, the conductive core materials 10 are resin substrates containing carbon fibers. However, the conductive core materials 10 are not essentially such resin substrates and can be various substrates. The conductive core materials 10 can be, e.g., metal substrate of, e.g., invar, etc.

In the above-described embodiments, the insulation layers 14 are poly-para-xylylene film and polyimide film. However, the insulation layers 14 are not limited to them and can be, in addition to poly-para-xylylene, films of poly-para-xylylene-based resins, such as substituted poly-para-xylylene, etc. which are fluorinated poly-para-xylylene, chlorinated poly-para-xylylene, etc., which are partially substituted poly-para-xylylene. The insulation layer 14 can be films of, e.g., various polyimide-based resins and various epoxy-based resins.

In the above-described embodiments, the wirings 22a-22d are formed of copper film but are not essentially formed of copper film. The wirings can be formed of various conductive films.

In the above-described embodiments, the insulation layer 14 and the metal layer 40 are formed respectively in 1 layer. However, the insulation layer 14 and the metal layer 40 may not be formed essentially respectively in 1 layer. A plurality of the insulation layers 14 are formed, or a plurality of sets of the metal layer 40 and the insulation layer 14 formed on the metal layer 40 are formed, whereby the insulation can be made higher.

In the above-described embodiments, the insulation layers 14 are formed by vapor deposition and electrodeposition. However, the method for forming the insulation layers 14 is not limited to them.

In the above-described embodiments, the through-holes 12 are formed in the conductive core materials 10 by cutting with drills. However, the method for forming the through-holes 12 is not limited to the cutting. The through-holes 12 may be formed by, e.g., punching with punching dice, abrasion with lasers or others.

In the above-described embodiments, the resin 18 is buried in the through-holes 12 in the conductive core materials 10 and the insulation layers of the resin 18 are formed on the inside walls of the through-holes 12. However, what are buried in the through-holes are not essentially resin and can be various insulation materials.

In the above-described embodiments, the wirings are formed on the upper surface and the undersurface of the conductive core material 10. However, wirings may be formed on at least one surface of the conductive core material 10.

What is claimed is:

1. A wiring board comprising:
   a plate-shaped conductive core material with a through-hole formed in, the conductive core material is a resin substrate containing carbon fibers;
   a first insulation layer formed on a surface of the conductive core material and on an inside wall of the through-hole;
   a first wiring formed on the surface of the conductive core material with the first insulation layer formed on;
   a second wiring formed in the through-hole with the first insulation layer formed in and electrically connected to the first wiring; and
   a second insulation layer formed between the first insulation layer and the second wiring, or between the inside wall of the through-hole and the first insulation layer.

2. A wiring board according to claim 1, further comprising a metal layer formed between the inside wall of the through-hole and the first insulation layer.

3. A wiring board according to claim 1, wherein the first insulation layer is formed of poly-para-xylylene-based resin.

4. A wiring board according to claim 1, wherein the first insulation layer is formed of polyimide-based resin.

5. A wiring board according to claim 1, wherein a burr is formed on the inside wall of the through-hole, and the first insulation layer is formed, covering the burr.

6. A wiring board comprising:
   a plate-shaped conductive core material with a through-hole formed in;
   a first insulation layer formed on a surface of the conductive core material and on an inside wall of the through-hole;
   a first wiring formed on the surface of the conductive core material with the first insulation layer formed on:
   a second wiring formed in the through-hole with the first insulation layer formed in and electrically connected to the first wiring:
   a second insulation layer formed between the first insulation layer and the second wiring, or between the inside wall of the through-hole and the first insulation layer and
   a metal layer formed between the second insulation layer and the first insulation layer.

7. A wiring board according to claim 6, wherein the conductive core material is a metal substrate.

* * * * *